United States Patent [19]

Lynch et al.

[11] 3,977,075

[45] Aug. 31, 1976

[54] METHOD OF FABRICATING MULTI-LAYER PRINTED CIRCUIT BOARD

[75] Inventors: James Edward Lynch; Kenneth Ronald Parmer, both of Harrisburg; Robert Franklin Cobaugh, Elizabethtown, all of Pa.

[73] Assignee: AMP Incorporated, Harrisburg, Pa.

[22] Filed: June 17, 1975

[21] Appl. No.: 587,767

Related U.S. Application Data

[60] Division of Ser. No. 340,797, March 13, 1973, Pat. No. 3,905,665, and a continuation-in-part of Ser. No. 321,076, Jan. 4, 1973, abandoned, and a continuation-in-part of Ser. No. 193,366, Oct. 28, 1971, abandoned, and a continuation of Ser. No. 224,504, Feb. 8, 1972, abandoned, said Ser. Nos. 340,797, and said Ser. No. 224,504, each is a continuation-in-part of Ser. No. 166,540, July 27, 1971, abandoned, said Ser. No. 224,504, is a continuation-in-part of said Ser. No. 193,366.

[52] U.S. Cl. ............................... 29/628; 29/629; 29/630 R; 228/180 A; 228/242; 228/246; 228/258; 339/17 M; 339/176 MP
[51] Int. Cl.² .................. H05K 1/04; H05K 1/14; H05K 3/36
[58] Field of Search ............... 29/630 D, 629, 628, 29/630 R; 317/101 DH, 101 CC, 101 CE, 101 D; 228/178, 179, 180, 232, 240, 242, 245, 246, 257, 258, 20, 254; 339/17 R, 17 C, 17 CF, 17 L, 17 LC, 17 LM, 17 M, 59 R, 59 M, 91 R, 61 R, 61 M, 176 MP, 176 MF, 65, 184 M, 75 MP, 186 M, 217 RS, 276 R, 276 T, 276 SF, 275 B

[56] References Cited
UNITED STATES PATENTS

| | | | |
|---|---|---|---|
| 3,214,827 | 11/1965 | Phohofsky | 228/258 X |
| 3,444,619 | 5/1969 | Lomerson | 29/630 R |
| 3,474,521 | 10/1969 | Schwenn | 29/628 X |
| 3,673,551 | 6/1972 | McDonough | 339/191 M X |
| 3,693,135 | 9/1972 | Vaurick et al. | 339/176 MP X |
| 3,807,045 | 4/1974 | Bennett et al. | 29/629 |
| 3,808,578 | 4/1974 | Hansen | 339/176 MP X |

*Primary Examiner*—Victor A. DiPalma
*Attorney, Agent, or Firm*—Gerald K. Kita

[57] ABSTRACT

According to one aspect of the disclosure, a planar substrate receives a plurality of conductive posts therein, which posts include an offset medial portion having a laterally projecting notch portion. Certain posts are arranged with their notch portions in coplanar relationship and in latching registration with an interior sidewall portion of a housing received over the posts. Accordingly, the housing provides an insulating receptacle shroud for the posts and is latchingly retained in place without a need for attachment to the substrate. The shroud is also provided with card guides connected thereto by integral hinge portions enabling alignment of, and reducing twisting and warping of, the card guides. The card guides are additionally coupled together with rails further reducing twisting and warping of the guides. The terminals are advantageously mounted in strip form for ease in manufacture and assembly to the substrate.

According to another aspect of the disclosure, a plurality of discrete electrically conductive posts are initially connected on selected center spacings to a common carrier strip without interconnecting portions between adjacent posts. A portion of the carrier strip is severed to separate a selected number of posts, which are inserted in a substrate. The carrier strip maintains the posts in alignment and in their desired center spacings. After the posts are secured to the substrate by reflow of a solder band provided on each post, the carrier strip is removed, allowing a connector housing to be slipped over the posts. The posts will interlock with the connector housing and positively anchor it to the substrate. In another embodiment, the connector housing is placed in registration on the substrate and the selected posts are then inserted simultaneously in the connector housing and in the substrate. When the solder bands of the posts are reflowed, the posts thus become secured to the substrate and simultaneously anchor the connector housing in positive location on the substrate. As in all the embodiments, the carrier strip connected to the posts is removed after solder reflowing.

The disclosure further relates to a printed circuit board having mounted thereon a plurality of electrically conducting post-type contacts, enclosed by a removable electrically insulating housing latchably secured to a selected contact, and to a multi-layer printed circuit board and a method of fabrication thereof.

1 Claim, 24 Drawing Figures

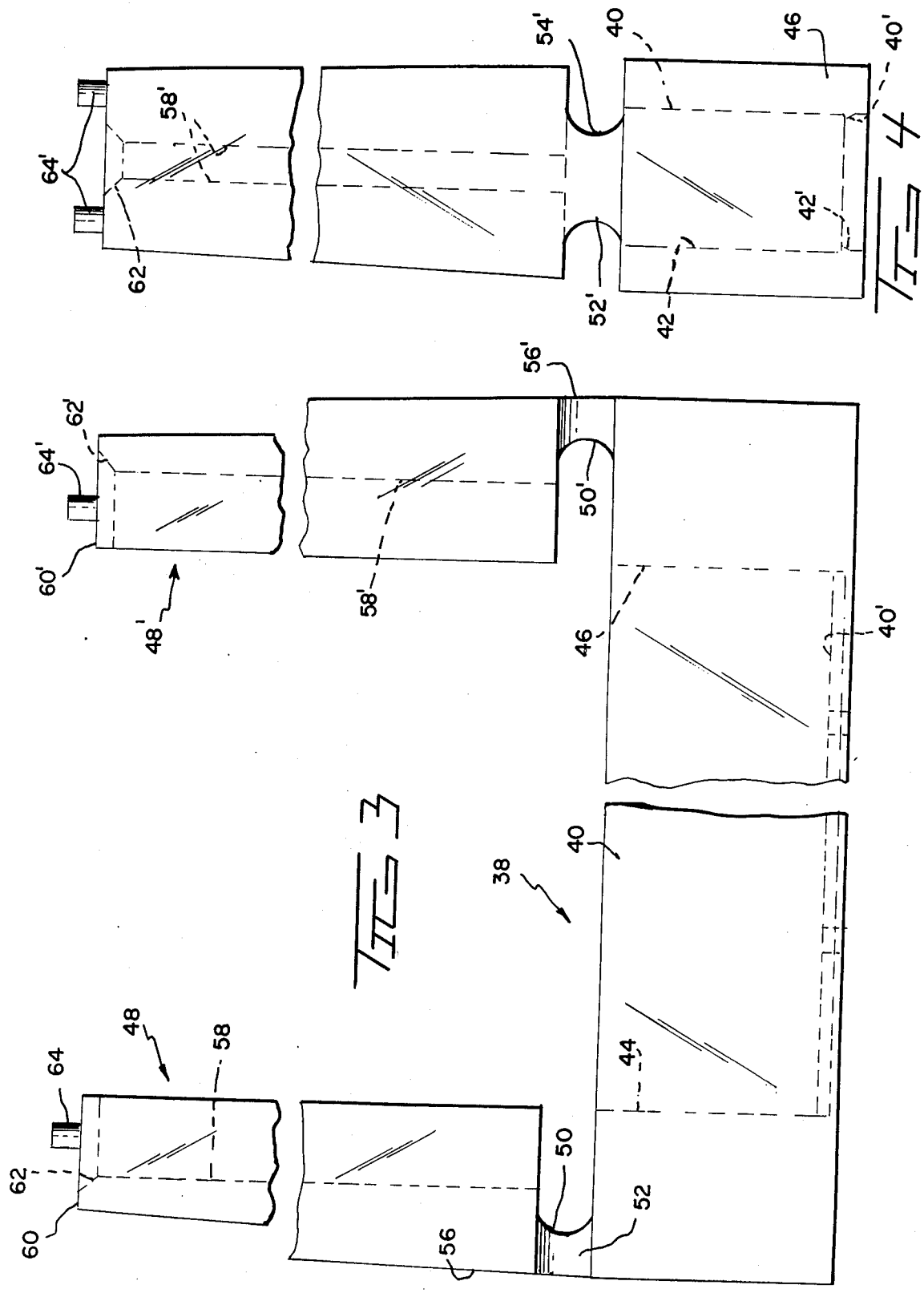

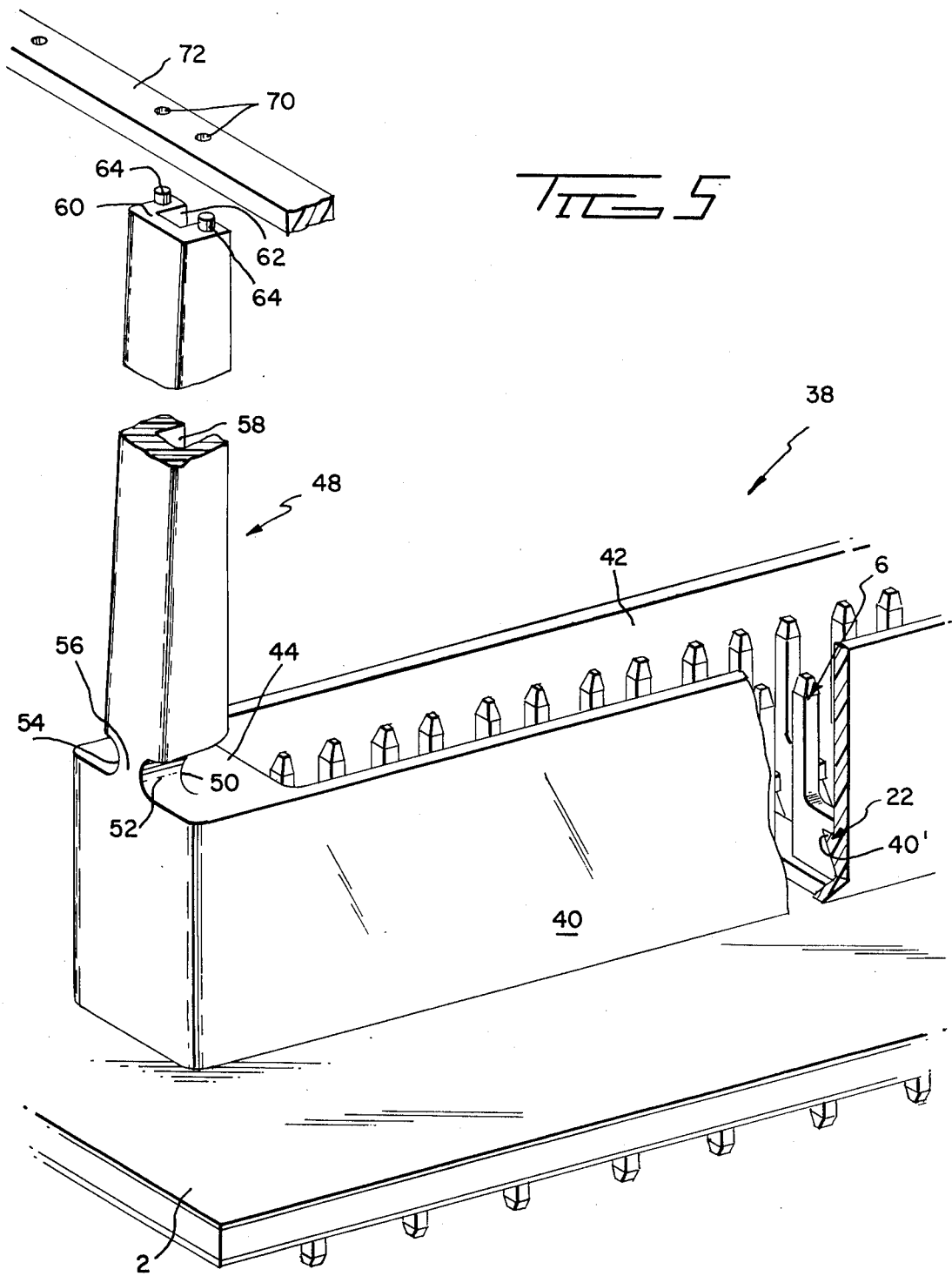

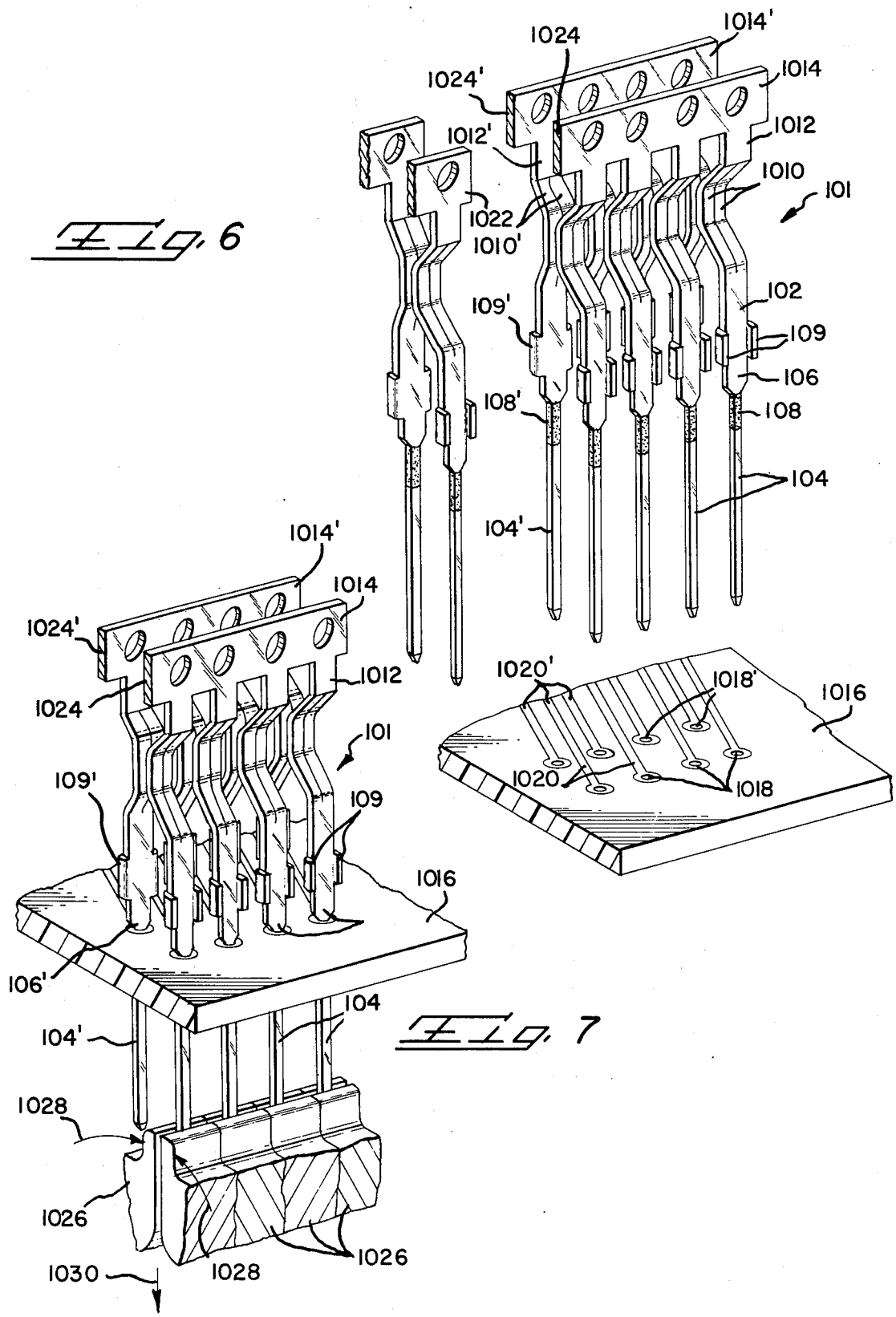

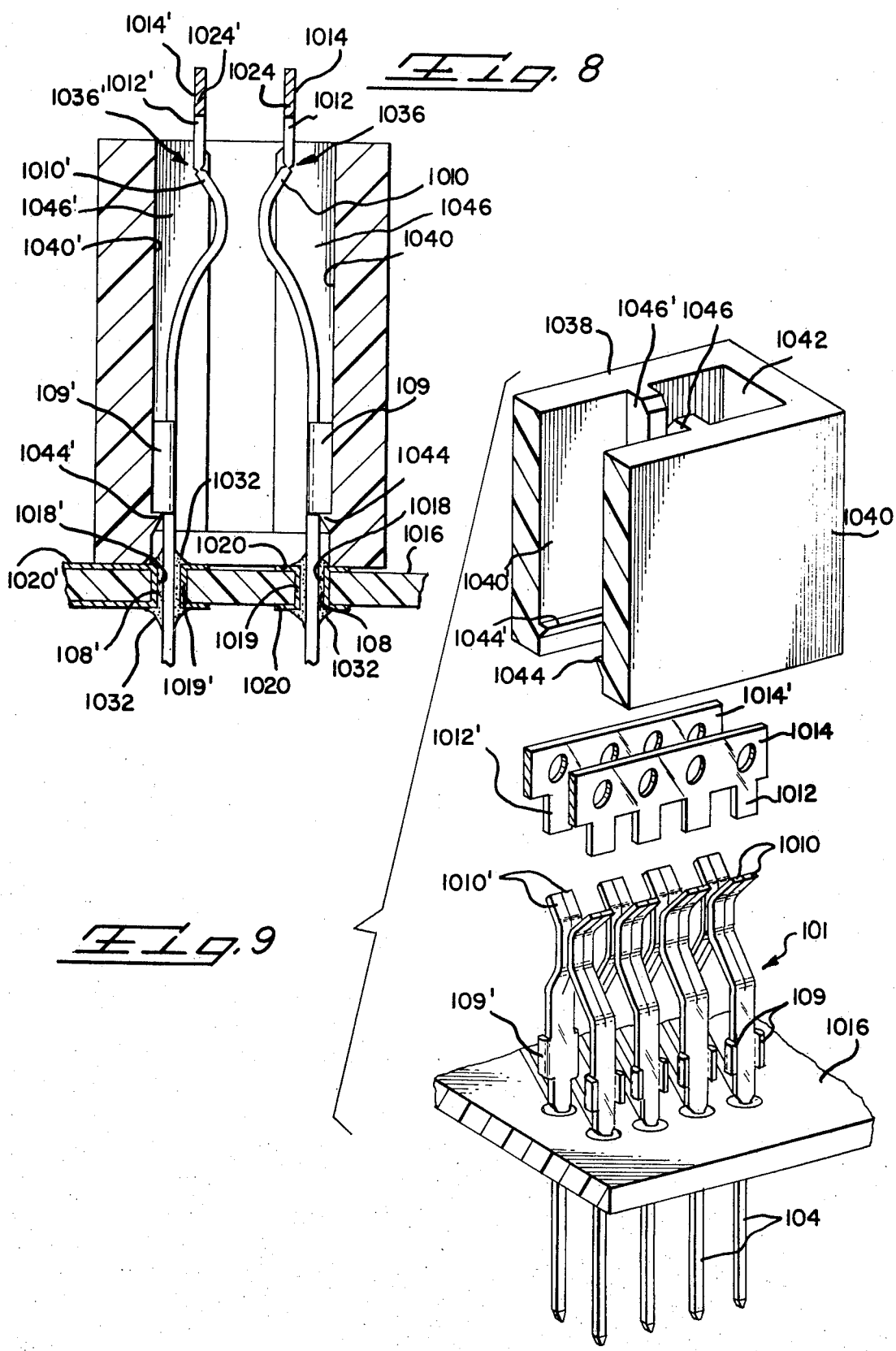

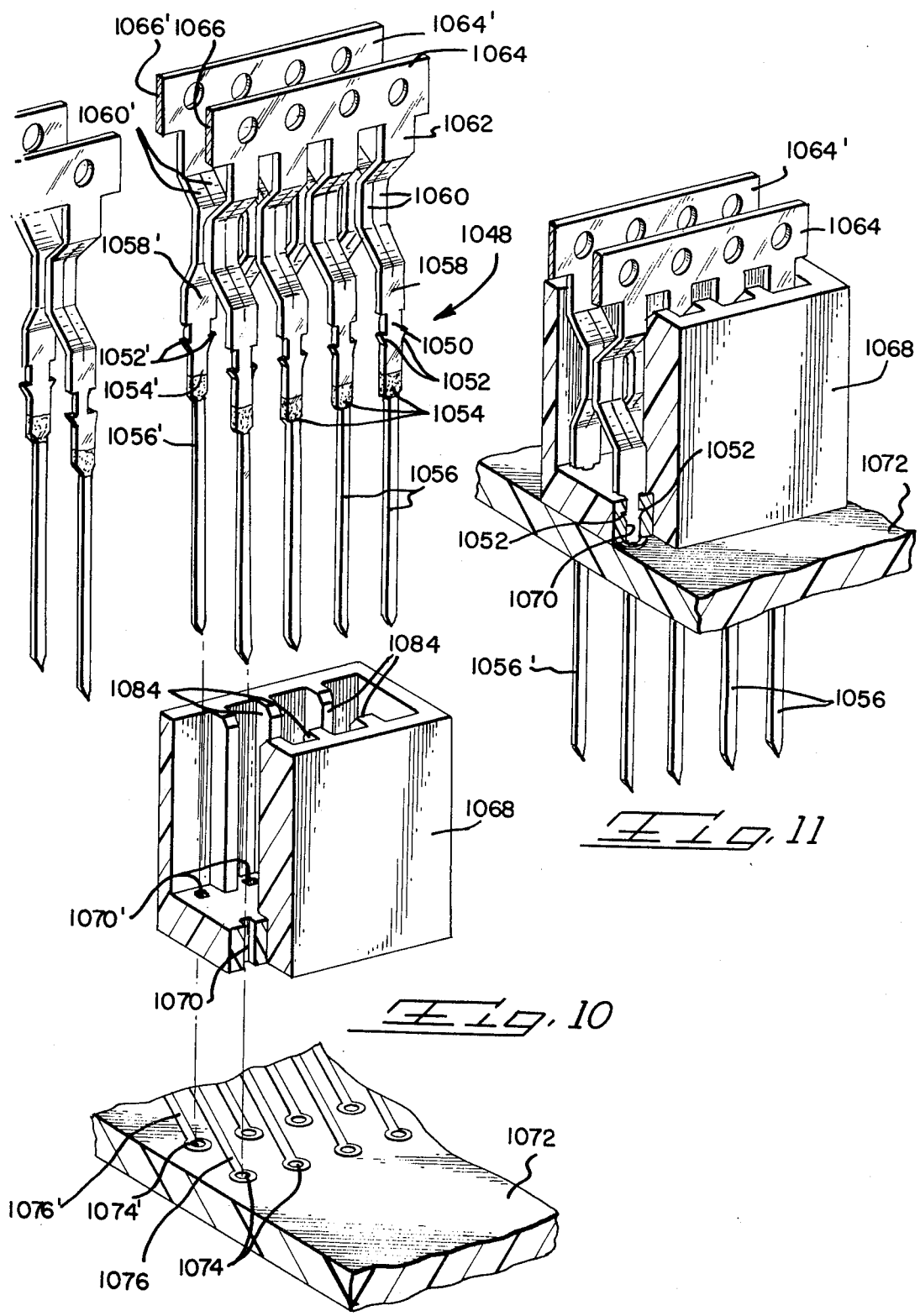

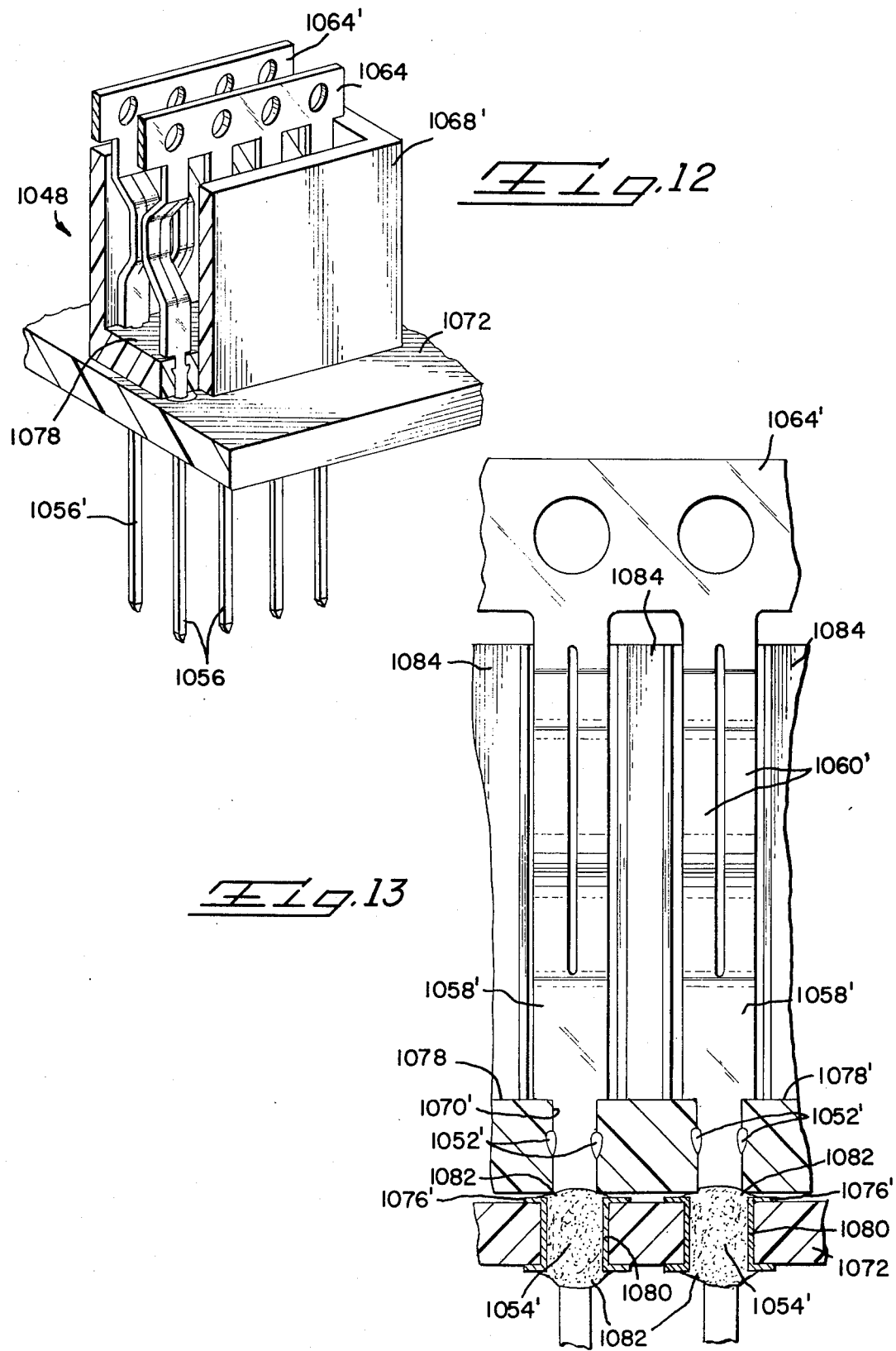

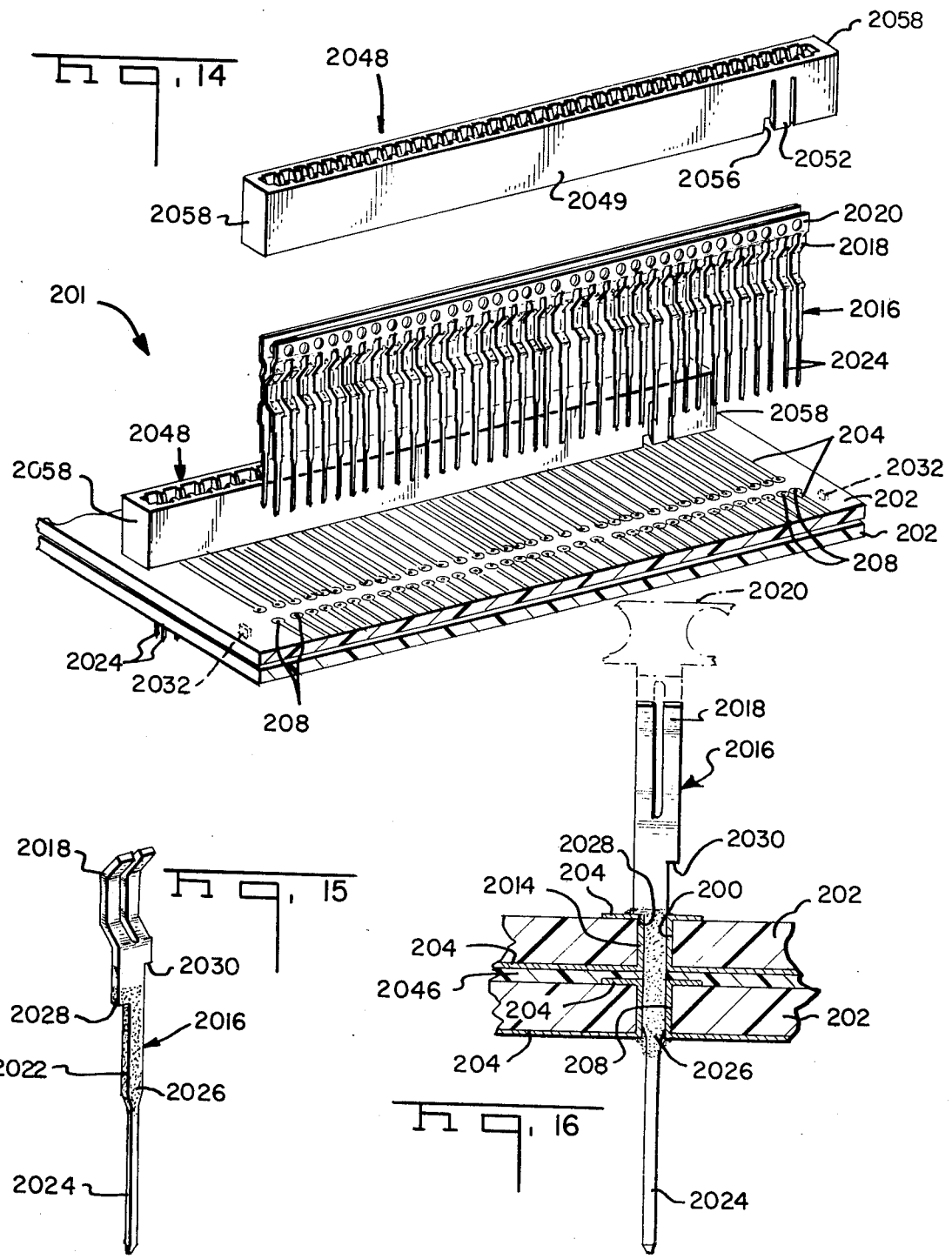

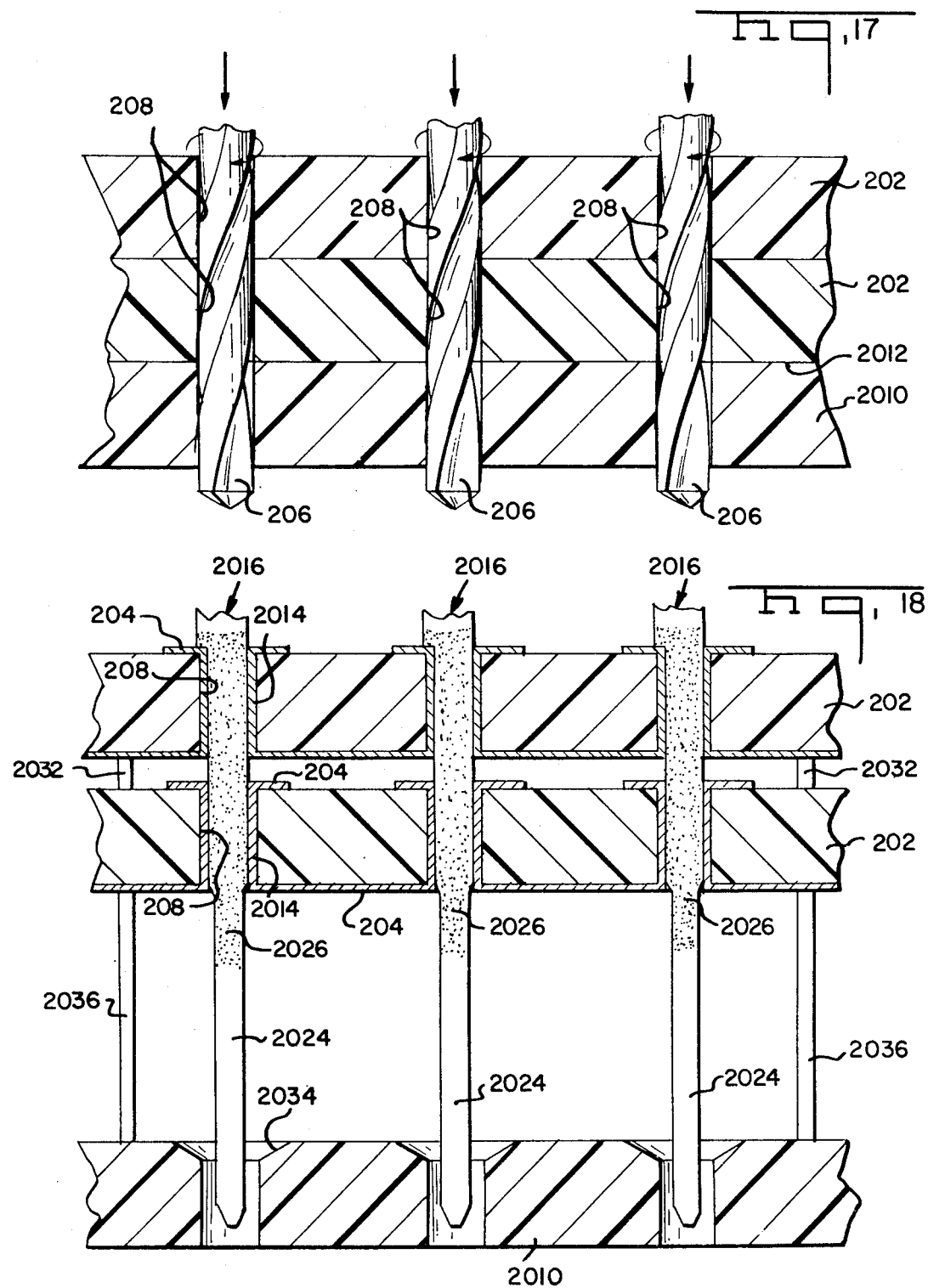

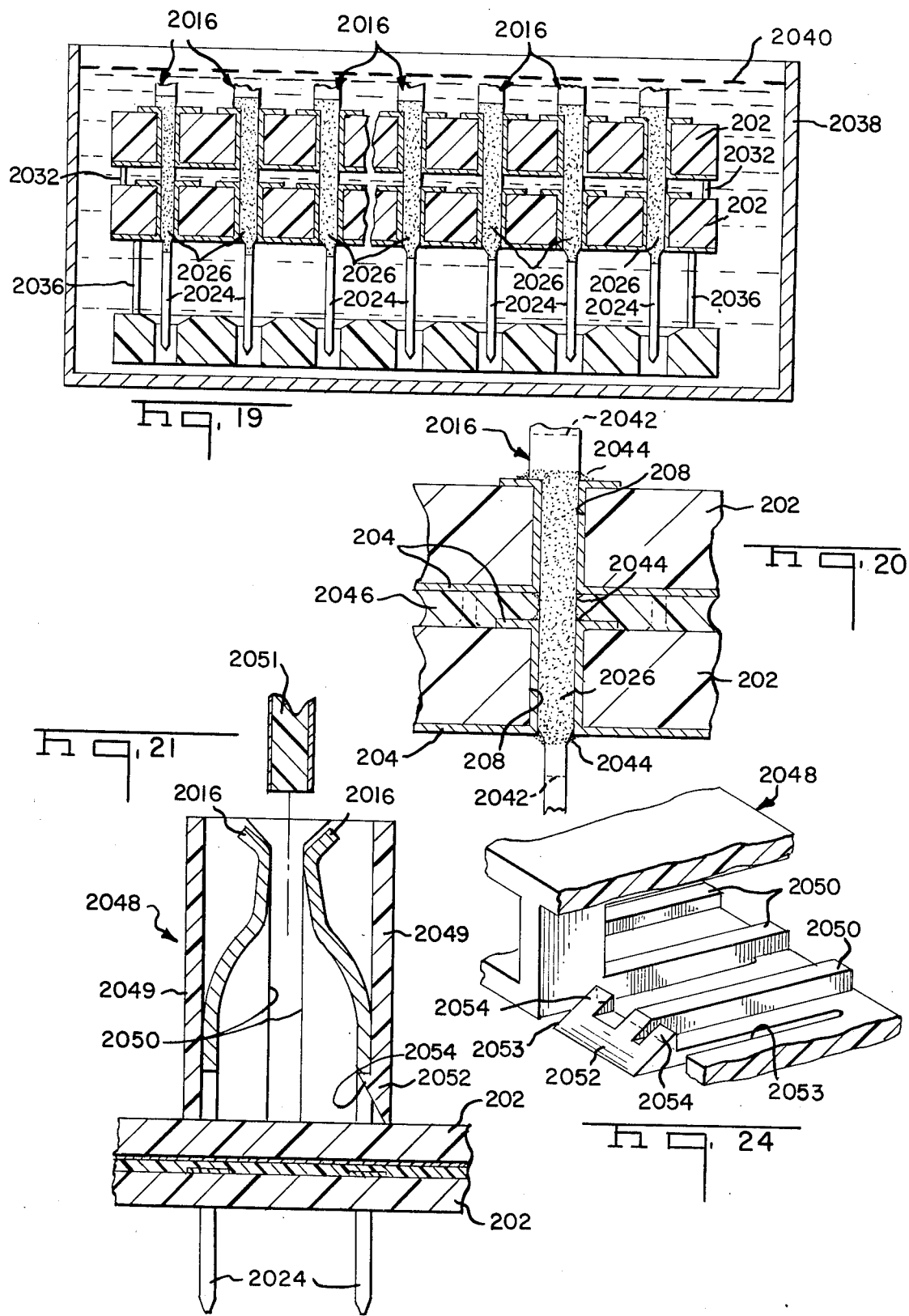

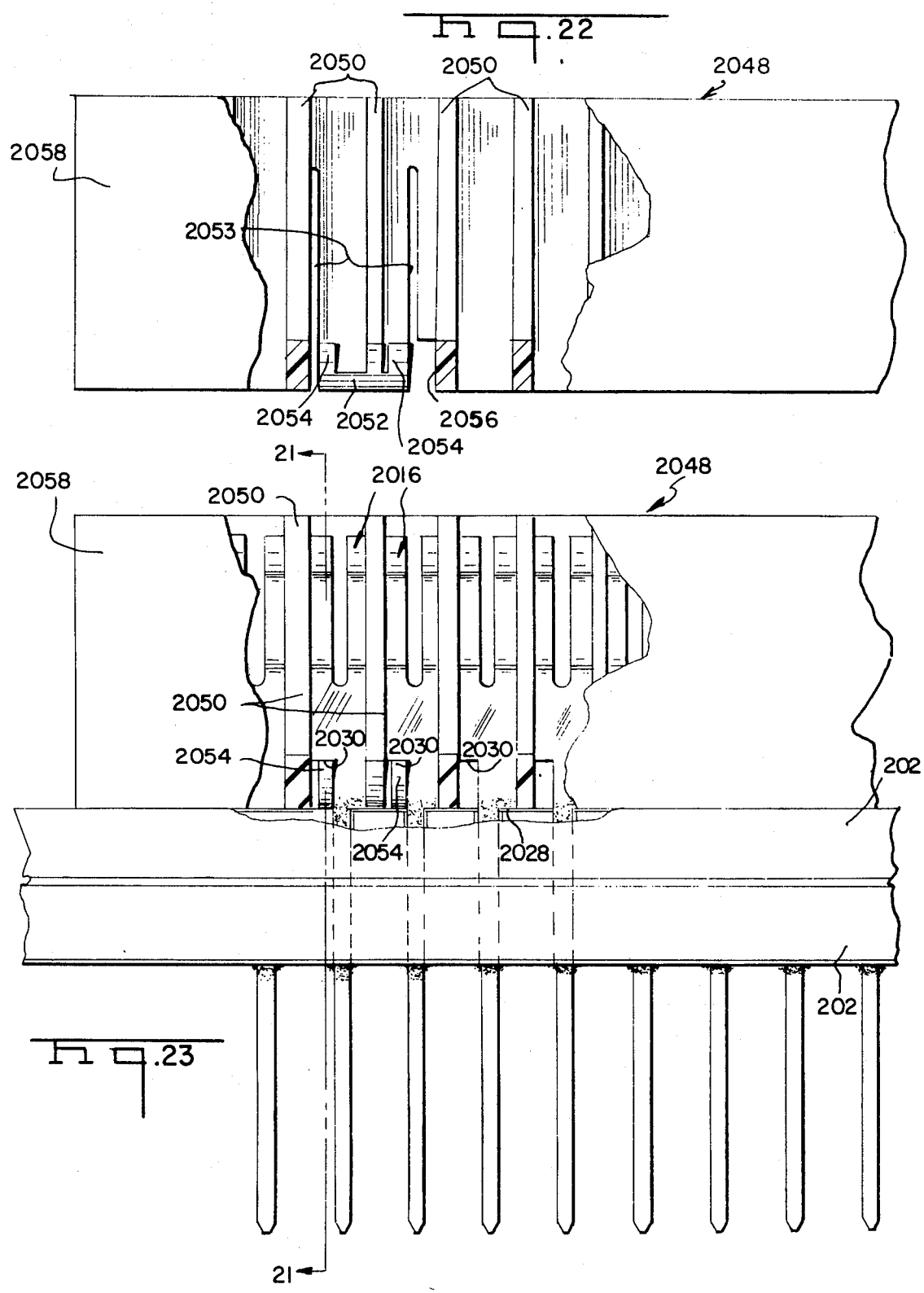

METHOD OF FABRICATING MULTI-LAYER PRINTED CIRCUIT BOARD

CROSS REFERENCES TO RELATED APPLICATIONS

This is a division of application Ser. No. 340,797, filed Mar. 13, 1973, now U.S. Pat. No. 3,905,665.

This application is a continuation-in-part of application Ser. No. 321,076, filed Jan. 4, 1973 and now abandoned, which is a continuation of application Ser. No. 166,540, filed July 27, 1971 and now abandoned. This application is also a continuation-in-part of application Ser. No. 193,366, filed Oct. 28, 1971 and now abandoned. This application is also a continuation of application Ser. No. 224,504, filed Feb. 8, 1972 and now abandoned which is continuation-in-part of application Ser. No. 166,540 and application Ser. No. 193,366.

BACKGROUND OF THE INVENTION

1. Field of the Invention

The present invention relates to an insulation housing and card guide, and more particularly to an insulation housing and card guide for mounting on a substrate. The present invention also relates to the combination of a printed circuit board having mounted thereon a plurality of electrically conducting post-type contacts, enclosed by a removable electrically insulating housing latchably secured to a selected contact, and also to a multi-layer printed circuit board and a method of fabrication thereof. The present invention further relates to a method and apparatus for assembling electrically conductive posts to a substrate, and more particularly to method and apparatus for assembling conductive post-type contacts to a substrate which advantageously permits positive location and anchoring of a connector housing to the substrate and in enclosing relationship over the assembled contacts.

2. Description of the Prior Art

The present invention satisfies the need for a low electrical insulation housing for containing a plurality of electrical terminals mounted to a substrate such as a printed circuit board. The invention further satisfies the need for inexpensive guides for a card which is to be electrically connected to and disconnected from the plurality of electrical terminals contained within the insulation housing. In addition to the objective of low cost, the card guides associated with the housing should be free of warpage and misalignment in order to receive and permit removal of a card without binding. In meeting these objectives, the insulation housing according to the present invention is not directly connected to the printed circuit board or substrate. Instead, the housing is advantageously detachably latched to the electrical terminals mounted on the substrate. The housing thereby serves as a shroud for protecting the electrical terminals and may be readily removed when desired. Each housing includes a pair of channel guides for receiving therebetween opposed margins of a card. Each channel is connected to the housing by an integral hinge or neck portion. This feature permits the rails to flex resiliently in cantilever fashion to enhance alignment thereof so that a card may be received between the channels without binding. The card guide channels of a plurality of housings are connected to a common stiffener rail to prevent warpage and twisting of the channels.

The electrical terminals to which the insulation housing is detachably latched comprises a first conductive post portion offset from a second conductive post portion, with a shelf portion for receiving the edge of the card in registration thereagainst. Adjacent to the shelf portion, each terminal is provided with a lateral notch portion. When a plurality of the posts are mounted to the substrate, the notch portions of selected ones of the terminals are arranged in aligned generally coplanar relationship. The insulation housing is received over a plurality of the terminals and includes an inner linear projection or flange portion which latchingly registers within the aligned notch portions of the terminals. Accordingly, the housing is fixedly mounted to the substrate without a need for a direct mechanical connection therebetween. The housing is advantageously detachable from the substrate by resiliently flexing the sidewalls and disengaging the flange portion thereof from the notch portions of the terminals.

As a further feature, the shelf portion of each terminal is provided with a frangible stem for connection to a carrier strip. Thus the carrier strip allows the terminals to be advantageously supplied and handled. The terminals are readily disconnected from the substrate by individually detaching each terminal from its frangible stem.

The present invention is also directed to fabrication of an electrical panel including a board substrate into which a plurality of electrically conducting post-type contacts are inserted. Post portions of the contacts protrude from one side of the substrate and advantageously receive point-to-point electrical wiring. Other portions of the posts protrude from the opposite side of the substrate to form electrical contacts suitable for electrical registration with electrical paths of a printed circuit board or card. In most applications, an electrically insulating connector housing insulates and protects the contact portions of the posts. The housing also must be secured on the surface of the substrate. In many cases the substrate is provided with plated circuit paths in addition to the point-to-point wiring provided by the conducting posts.

Heretofore time consuming successive steps were required to fabricate such a panel. Initially the contacts were inserted individually within the connector housing. The contacts has to be individually latched in the housing to prevent removal therefrom. As a practical matter, the housing provided a plurality of individual sockets having internal latching structure for receiving and latching onto an individual contact. The internal structure of such a connector housing was necessarily complex and was costly to design and fabricate. A great deal of time was expended to insure insertion and latching of each individual contact within a socket of the connector housing. Additional time was expended to assemble the connector housing and the retained posts to the substrate. Fasteners such as screws and the like were required to attach the connector housing to the substrate surface. The posts then protruded through the apertures in the substrate to receive the point-to-point wiring.

If it was desired to electrically connect the post-type contact to plated electrical paths of the substrate, each post portion was separately hand soldered to a plated path. This procedure resulted in satisfactory electrical joining, but was time consuming.

Some attempt was made to reduce the assembly time by sliding solder rings over the posts to be soldered, and simultaneously reflowing the solder by the application of heat, in an attempt to simultaneously solder all the posts to the plated paths. Often times the reflowed solder was of insufficient mass, or did not sufficiently wick into the substrate apertures to create a strong solder joint. This required inspection and testing after soldering to insure electrical continuity of the solder joints. Those joints which did not produce electrical continuity had to be repaired by hand soldering. Also those joints which produced electrical continuity but were structurally weak and subject to breakage at a later time also had to be replaced by hand soldering. It is not uncommon in a panel as above described to have a thousand soldered posts. If only one post in a thousand has an insufficient solder joint, representing a failure rate of 0.1%, then statistically every single panel would be inoperative if fabricated according to the above described assembly procedures. Thus there has been a long existing need in the prior art for a method of reliably assemblying a plurality of electrical contacts mechanically and electrically to a substrate and suitable for use with a connector housing enclosing the contacts.

In the present invention, a plurality of electrically conducting posts individually depend from a carrier strip on precise center spacings. The posts can be simultaneously assembled into apertures of a substrate having corresponding center spacings. Each post is provided with an encircling band of solder which registers internally of a corresponding substrate aperture. Advantageously upon reflow of the solder bands, each post is reliably mechanically and electrically joined to the substrate. This assembly procedure reduces the assembly time required for insertion of individual contacts. Assembly time is further reduced by simultaneously reflowing the solder bands of all the conducting contacts desirably inserted into the substrate. This eliminates the need for individually treating each post, either by hand soldering, or by applying solder rings individually over each contact subsequent to assembly of the posts in the substrate.

Each of the contacts is attached at its terminal end to the carrier strip with no interconnection between adjacent posts. This permits individual guiding of the posts into respective substrate apertures without undue bending or deflection of the carrier strip or the individual posts. The carrier strip supports the contacts in mutual alignment and on desired center spacings in the board.

By providing the solder bands on the posts prior to insertion in the substrate, the solder bands will be located radially internally of the apertures. Each solder band is of a selected band width to provide sufficient solder mass for filling the space between the lined aperture and the post inserted therein, and for the formation of fillets encircling and adhered to a conducting post at each end of a lined aperture. In addition, the solder band is precisely located internally of the lined aperture, such that upon reflow solder will ahere along the entire length of the aperture lining. Such a joint is more reliable than a hand soldered joint or the application of solder rings to the posts after insertion.

Soldering to the posts after insertion requires wicking of molten solder into the lined substrate apertures. A joint produced by this wicking action has a relatively high probability of failure. One cause of failure results from insufficient solder mass to completely fill the space between the lined aperture and a post inserted therein, even though solder fillets are formed at each end of the aperture. The presence of the solder fillets prevents inspection for solder voids internally of each aperture. Another cause of failure results from insufficient wicking action of solder internally of an aperture. Either of these results can produce failure, which is immediately detected by testing for electrical continuity. Even if electrical continuity is initially established the joint itself is structurally weak and will later fail upon breaking of the joint when subjected to normal handling and use.

The present invention is well suited for reducing panel assembly time, since the conducting posts are utilized to locate and anchor an enclosing connector housing to a substrate without the need for additional fasteners. According to one preferred embodiment, a connector housing is provided over the inserted contacts and is latchably joined thereto. As an alternative, the contacts may be inserted into the substrate and the connector housing simultaneously. In this embodiment, reflowing of the solder bands provided on the posts is accomplished with the connector housing in place on the substrate.

As a further feature of the invention, since the posts remain attached to their carrier strip until positively joined to the substrate by reflowing of their solder bands, they remain in desired alignment without the need for individual aligning slots in the connector housing. Accordingly, the present invention allows for the use of a connector housing with relatively simple interior structure. This further reduces panel assembly time since the posts need not be interfitted within individual slots during assembly. In addition, the costs of material and fabrication in the connector housing itself are substantially reduced due to its relatively simple interior structure.

In addition, each of the contacts according to the present invention is provided with a selected mass of solder adhered thereto in a selected band width and positively located on a selected medial portion of the contact. Each contact is further provided with structure for locating it in position on a printed circuit board, for limiting insertion thereof in a printed circuit board, as well as for positively positioning the solder band interiorly of a plating lined hole of the board into which the contact is inserted.

Each contact is additionally provided with structure to which a portion of the encircling insulation housing is removably latched.

The insulation housing includes an integral latch portion. When the housing is received over a plurality of contacts according to the present invention, the latch portion will resiliently register in latching relationship on a selected one of the contacts, advantageously securing the housing to the selected contact and thereby in fixed mounted position on the printed circuit board. To remove the housing, a tool may be used to manually pry the resilient latch portion to disengage it from the selected contact and allow removal of the housing from the enclosed plurality of contacts.

According to a feature of the present invention, when all the desired number of contacts are mounted in corresponding plating lined apertures of the printed circuit board, all the solder bands of the posts are simultaneously heated to reduce the solder bands to a molten state and reflowed by wicking action into the clearances defined between the contacts and the apertures receiving the contact to make positive electrical and mechanical connections of the contacts to the plating lined apertures. Such connection technique is disclosed in copending application Ser. No. 193,366, filed Oct. 28, 1971.

Another salient feature of the present invention is practiced during connection of the contacts to the printed circuit board. More specifically, the plating lined apertures of the boards are arranged in rows, each row receiving a corresponding row of contacts inserted therein. A common carrier strip remains attached to the individual ends of corresponding contacts in each row. The carrier strip retains the contact ends in desired alignment during reflow of the solder, in accordance with the disclosure of copending application Ser. No. 193,366, filed Oct. 28, 1971. The medial portions of the posts in each row are maintained in desired alignment since they are received in the corresponding plating lined apertures of the board. The free ends of the contacts of each row, namely the ends which are not connected to the carrier strip, are received in apertures of an auxiliary board or substrate. The apertures of the auxiliary board are on the same center spacings as are the plating lined apertures of the printed circuit board. Thus such free ends of the contacts of each row are maintained in desired alignment by the auxiliary board. The contacts are maintained in alignment by the carrier strip, the printed circuit board and the auxiliary board while the solder bands are heated are reflowed, then subsequently allowed to cool in order to form rigid solder joints positively connecting individual contacts mechanically and electrically to the plating lined holes of the printed circuit board. Upon cooling of the reflowed solder, rigid joints are obtained, allowing removal of the auxiliary boards and the common carrier strip portion from each row of posts without disturbing the desired alignment of the contacts in the printed circuit board.

According to a further feature of the present invention, the contacts provided with solder bands may be utilized to connect together a plurality of printed circuit boards in stacked relationship. Generally, a single printed circuit board has a limited surface area which accordingly limits the number of plated circuit paths which can be adhered to the surface. It is common to use both a top surface and a bottom surface of a printed circuit board for carrying printed circuit paths. It is often desirable to use a second printed circuit board additional circuit paths which would not otherwise fit on a single printed circuit board already crowded with circuit paths. It is also often desirable to provide design changes on a secong printed circuit board. Use of a second board obviates the need to discard the original printed circuit board in favor of a redesigned board. Thus, there are many instances where two printed circuit boards are favored over the use of a single board. Where two boards are desirable, it is necessary to electrically interconnect the circuit paths of the two boards. According to the present invention, a plurality of boards may be utilized in stacked relationship, with the required electrical interconnections between such boards being accomplished by a plurality of contacts according to the present invention received in plating lined apertures of the boards. To provide a positive electrical interconnection between the boards, the solder bands of the interconnecting contacts are reflowed and then cooled to form solder joints, thereby electrically and mechanically connecting the contacts to plating lined apertures of the stacked boards. To substantially reduce assembly time, it is advantageous that all the contacts be inserted in the plating lined apertures of the stacked boards, and all the solder bands of the inserted contacts be simultaneously reflowed and then cooled to form the individual solder joints. During solder reflow and cooling to form the joints, alignment of the contacts is assured by utilizing the attached carrier strip and auxiliary board alignment technique as above described.

The present invention is particularly useful for fabricating a multi-layer printed circuit board. Generally, a multi-layer board includes a plurality of stacked planes with circuit paths being carried in a plurality of such planes. Interconnections are required between circuit paths of different planes. The location of such interconnections between planes as well as routing of the plated paths themselves are of such design complexity that automated computer design is required. In addition, fabrication of the multi-layer board must also be accomplished by automated techniques. The present invention permits design and fabrication of a multi-layer board without the need for expensive automated computer equipment. It therefore provides a technology enabling the design and fabrication of complex electronic circuit boards without a need for investing in expensive automated equipment. The present invention accordingly enhances entry of small companies into the industry of complex electronic circuitry dominated by a relatively few large companies.

SUMMARY OF THE INVENTION

Accordingly, it is an object of the present invention to provide an insulating housing for a plurality of electrical terminals mounted in a substrate.

Another object of the present invention is to provide a plurality of electrical terminals in a substrate with an encircling insulation housing which is not directly connected to the substrate.

Another object of the present invention is to provide a plurality of electrical terminals mounted in a substrate with an insulation housing encircling the terminals and including inner projecting portions detachably latched to notch portions in selected ones of the terminals.

Another object of the present invention is to provide a plurality of electrical terminals mounted in a substrate with an insulation housing serving as a shroud for the electrical terminals.

Another object of the present invention is to provide a plurality of electrical terminals mounted in a substrate and provided thereover with an insulation housing detachably latched to the terminals, which housing is provided with a pair of card guides mounted thereto for resilient cantilever action.

Another object of the present invention is to provide a housing for a plurality of electrical terminals having a pair of aligned card guide channels connected to the housing by integral reduced neck portions allowing resilient cantilever action of the card guide channels.

Another object of the present invention is provide a plurality of card guide channels mounted for resilient cantilever action on respective insulation housings for electrical terminals, each of which channels detachably connected by a two-point support to a stiffening rail.

Another object of the present invention is to provide an electrical terminal including a first elongated post portion, a medial portion defining a generally planar shelf projecting laterally of the longitudinal axis of said post, a second elongated portion depending from said shelf and offset longitudinally of said post portion, and a notch portion located between the shelf portion and the second elongated portion.

Yet another object of the present invention is to provide an electrical terminal including a conductive post portion, a medial portion defining a generally planar shelf projecting laterally of the longitudinal axis of said post portion, a second elongated portion depending from said shelf and offset longitudinally of said post portion, a laterally recessed notch portion located between said shelf portion and said elongated portion, and a frangible stem connecting said shelf portion with a carrier strip to which a plurality of like electrical terminals are connected by respective frangible stems.

Another object of the present invention is to provide a method of assembling a substrate and a plurality of conducting post-type contacts.

Another object of the present invention is to provide a method for assembling a connector housing and a plurality of conducting post-type contacts to a substrate having electrical paths to which the posts are electrically joined.

Another object of the present invention is to provide apparatus in the form of electrically conducting posts, which are individually joined to a common carrier strip without any interconnection between individual posts, and which and adapted for mass insertion within correspondingly spaced apertures of substrate.

Another object of the present invention is to provide a plurality of conducting contact posts individually joined to a carrier strip on precise center spacings without interconnection between individual posts, with each post provided with a band of solder mass of selected band-width, wherein each solder band is selectively located along the length of each contact and being reflowable to positively joint the posts to a substrate.

Another object of the present invention is to provide a method for assembling a plurality of individual conducting posts simultaneously within selected apertures of a substrate while utilizing a common carrier strip of the posts for maintaining the posts in desired alignment and center spacings until the posts are positively secured to the substrate.

Another object of the present invention is to provide apparatus in the form of an electrically insulating housing enclosing a plurality of electrically conducting posts, with the posts locating and anchoring the housing in position on a substrate, thereby eliminating the need for additional fasteners.

A further object of the present invention is to provide apparatus in the form of a combination of electrically insulating housing enclosing a plurality of electrically conducing posts, the posts mechanically connecting and anchoring the housing to a substrate without the need for additional fasteners, and the posts being maintained in desired alignment and precise center spacings, initially by a common carrier strip, and subsequently by being positively secured to the substrate, with the housing being substantially free of sockets or separating partitions between adjacent enclosed posts.

Another object of the present invention is to provide a method for fabricating a plurality of conducting posts to a common carrier strip and utilizing the carrier strip to allow simultaneous insertion and assembly of the posts in a substrate, with the carrier strip maintaining the posts in alignment and on selected center spacings until the posts are positively secured to the substrate.

Another object of the present invention is to provide a method for fabricating a plurality of conducting posts on a common carrier strip, using the carrier strip to maintain a plurality of posts in desired alignment and center spacings while the posts are inserted and secured in a substrate, and utilizing the posts to mechanically connect a connector housing to the substrate without a need for additional fasteners.

Another object of the present invention is to provide a method and apparatus for fabricating a multi-layer circuit board wherein a plurality of stacked printed circuit boards are interconnected by electrical contacts having solder bands thereon which are reflowed simultaneously to form a plurality of positive solder joints interconnecting the contacts between selected plated paths carried by the plurality of stacked printed circuit boards.

Another object of the present invention is to provide a method for fabricating a multi-layer circuit board wherein a stacked plurality of separate printed circuit boards have their circuit paths thereon selectively interconnected by corresponding electrically conductive contacts provided with solder bands thereon which are simultaneously reflowed by a flowable dielectric at elevated temperature, with both the reflowed solder and the fluid dielectric being subsequently cooled to a solid state, with the solder forming positive joints securing the boards in stacked relationship on the contacts and electrically interconnecting the contacts between circuit paths of different boards, and with the solid dielectric filling a clearance space between adjacent stacked boards to provide electrical insulation between the circuit paths of adjacent boards and to encapsulate the plurality of stacked boards into a single multi-layer board structure.

It is another object of the present invention to provide an electrically conductive post-type contact with an adhered band of solder of selected band width, together with structure for locating the contact in position on a printed circuit board and for locating the solder band in a desired position interiorly of a plating lined aperture of the printed circuit board, the contact being further provided with structure to which an insulating connector housing may be resiliently latched thereto.

Another object of the present invention is to provide an electrically insulating connector housing with an integral resilient latch portion for latchably securing the connector housing to at least one of a plurality of electrical contacts, which are mounted on a printed circuit board or substrate and which are enclosed by the housing.

Another object of the present invention is to provide a method of fabricating an assembly of a printed circuit board, a plurality of electrically conducting contacts and a removable electrically insulating housing with a latching portion resiliently latched to at least one of the contacts, thereby retaining the housing in desired fixed position on a printed circuit board.

Another object of the present invention is to provide a method of fabricating an assembly of a printed circuit board and a plurality of electrically conducting post-type contacts, with the contacts being maintained in desired alignment by an auxiliary board or substrate and a carrier strip to which the contact are attached during the formation of solder joints securing the contacts mechanically and electrically to the printed circuit board.

It is another object of the present invention to provide an insulating housing with integral latch portions on sidewalls of the housing for resilient latching to selected ones of a plurality of electrical contacts, with said latches being spaced from each other to prevent weakening of the housing.

It is another object of the present invention to provide an insulating housing with integral latch portions on sidewalls of the housing for resilient latching of selected ones of a plurality of electrical contacts, with said latches being spaced from each other to prevent weakening of the housing, and with said latches being spaced from the housing ends to permit trimming off an end of the housing or to permit abutting together the ends of an adjacent pair of such housings.

BRIEF DESCRIPTION OF THE DRAWINGS

A more complete appreciation of the invention any many of the attendant advantages thereof will be readily obtained as the same becomes better understood by reference to the following detailed description when considered in connection with the accompanying drawings, wherein:

FIG. 3 is a fragmentary elevation of an insulation housing according to the present invention illustrating a pair of card guide rails connected by integral reduced neck portions;

FIG. 4 is a side elevation of the preferred embodiment shown in FIG. 3;

FIG. 5 is a fragmentary perspective of the preferred embodiment as shown in FIG. 1 with parts broken away and with parts in exploded configuration to further illustrate the details thereof;

FIG. 6 is a fragmentary perspective of first and second rows of conducting posts individually provided with solder bands and provided on respective common carrier strips, with a substrate shown in exploded configuration and having spaced apertures into which corresponding posts are inserted;

FIG. 7 is a fragmentary perspective of the preferred embodiment shown in FIG. 6 with the first and second rows of conducting pins inserted within the corresponding apertures of a substrate, and further illustrating, a plurality of jaws for simultaneously gripping and pulling a plurality of posts in order to seat them on the substrate and in corresponding apertures of the substrate;

FIG. 8 is a fragmentary enlarged elevation of the preferred embodiment as shown in FIG. 7 together with an insulating connector housing encircling the rows of conducting posts, and further illustrating, the solder bands on the posts being reflowed to positively join the posts to conducting liners of the substrate apertures and to form solder fillets at each end of the corresponding substrate apertures, with the posts mechanically connecting and anchoring the housing to the substrate without a need for additional fasteners;

FIG. 9 is a fragmentary perspective of the preferred embodiment as shown in FIG. 8 with the connector housing and the carrier strips of the first and second rows of posts in exploded configuration to illustrate that when the posts are positively joined to the substrate by reflowing the solder bands thereof the carrier strips may be removed either prior to or subsequent to the application of the connector housing over the posts;

FIG. 10 is a fragmentary perspective with parts in section and with parts broken away and illustrating an alternative embodiment according to the present invention including first and second rows of electrically conducting post-type contacts each provided with a controlled band width of solder and individually connected at a terminal end to a corresponding carrier strip together with a portion of a substrate as a connector housing initially positioned on the substrate;

FIG. 11 is a fragmentary perspective of the preferred embodiment as shown in FIG. 10 with parts assembled and with parts broken away and with parts in section to illustrate the details thereof;

FIG. 12 is a fragmentary perspective of the preferred embodiment as shown in FIG. 11 together with an alternative connector housing which is absent interior slots or partitions;

FIG. 13 is an enlarged fragmentary elevation in section of a portion of the preferred embodiment shown in FIG. 12;

FIG. 14 is a fragmentary perspective with parts in exploded configuration and with parts in section illustrating the details of the combination of a printed circuit board, a plurality of contacts mounted thereto and an insulation housing encircling the contacts and latched to at least a selected one of the contacts;

FIG. 15 is an enlarged perspective of one of the contacts of the preferred embodiment as shown in FIG. 14;

FIG. 16 is an enlarged elevation with parts in section and with parts in phantom outline of the preferred embodiment as shown in FIG. 14;

FIG. 17 is a fragmentary elevation in section of a view illustrating a drilling operation during fabrication of a pair of printed circuit boards as shown in FIG. 14;

FIG. 18 is a fragmentary enlarged perspective illustrating a pair of printed circuit boards fabricated according to the techniques as shown in FIG. 17 and provided with plated electrical paths and plating lined holes receiving therein electrical contacts according to the preferred embodiments shown in FIGS. 14 and 15, thereby forming an assembly in preparation for a solder reflow operation;

FIG. 19 is a fragmentary elevation in section illustrating the assembly shown in FIG. 18 in a fluid at elevated temperature during a solder reflow operation;

FIG. 20 is an enlarged fragmentary elevation in section illustrating the assembly of FIGS. 18 and 19 subsequent to the reflow operation as shown in FIG. 19;

FIG. 21 is an enlarged elevation in section illustrating the details of the preferred embodiment as shown in FIG. 14, with the insulation housing latchably secured to at least a selected one of the contacts;

FIG. 22 is an enlarged fragmentary elevation with parts broken away and with parts in section illustrating the details of a preferred embodiment of the insulation housing according to the present invention;

FIG. 23 is an enlarged fragmentary elevation with parts broken away and with parts in section illustrating the details of the preferred embodiment as shown in FIG. 21; and FIG. 24 is a fragmentary perspective of a preferred embodiment of the connector housing as shown in FIGS. 24 and 23, with parts broken away to illustrate the details thereof.

DESCRIPTION OF THE PREFERRED EMBODIMENTS

Figure 1:
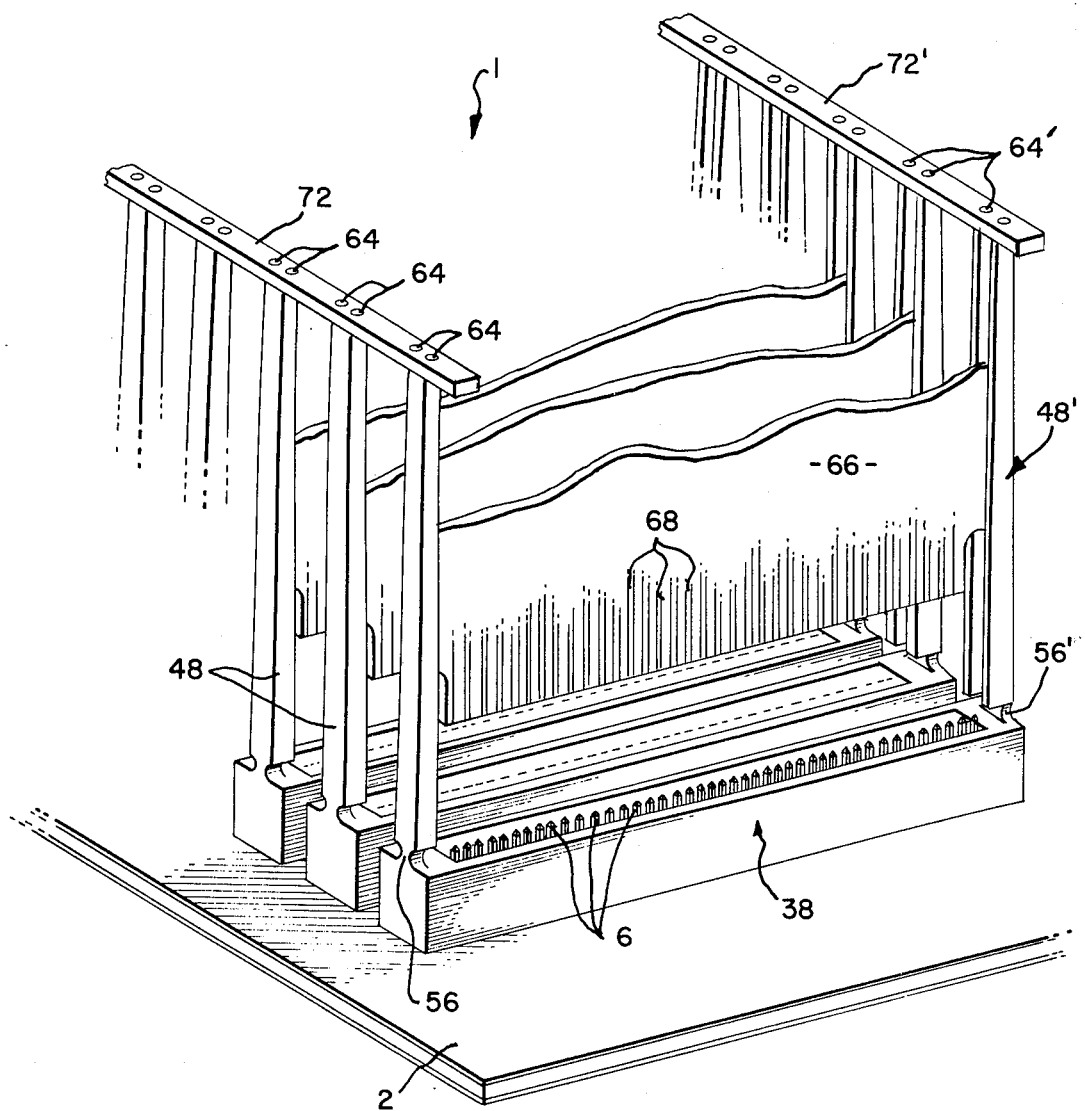
FIG. 1 is a fragmentary perspective of a preferred embodiment according to the present invention illustrating a plurality of electrical housings detachably latched to electrical terminals according to the present invention, with card guide channels connected to each housing by integral, offset reduced neck portions and with the corresponding channels of the housings being connected to a stiffener rail.

With more particular reference to FIG. 1 of the drawings, there is generally indicated at 1 a preferred embodiment of an electrical connector and card guide according to the present invention. As shown with reference to FIGS. 1 and 2, a substrate 2, which may comprise a printed circuit board or other suitable substrate, includes a plurality of apertures 4 therein which apertures may be lined with electrically conductive plating or solder. The apertures 4 receive corresponding electrical terminals generally indicated at 6. Each terminal is fabricated from a conductive metal and is characterized by a first elongated electrically conducting post 8 having a generally tapered tip 10. The post 8 is integral with a medial portion 12 defining a generally planar shelf portion 14 extending and projecting generally laterally of the longitudinal axis of the post portion 8. Each terminal 6 is further characterized by a depending elongated electrically conducting post portion 16 generally of rectangular or square configuration and provided with a tapered tip 18. The post portion 16 is integral with and depends from the medial portion 12. The longitudinal axis of the post portion 16 is offset laterally of the longitudinal axis of the post portion 8 and is located generally perpendicular to and below the shelf portion 14. A medial portion of the post 16 is provided thereover with a band of solder 20 deposited selectively in a controlled band width. In addition, the medial portion 12 of each terminal 6 is provided with a recessed lateral notch 22 adjacent to the shelf portion 14 and located between the shelf portion 14 and the elongated post portion 16. The notch portion 22 is of a configuration having an inverted generally planar wall 22 intersecting an inclined wall 24. As further shown in FIG. 2, each terminal 6 is initially provided with an integral elongated stem portion 26 projecting vertically from the corresponding shelf portion 14 and parallel to the post portion 8. Each stem portion 26 is integral with a side margin 28 of carrier strip 30. Each stem portion 26 is frangible generally at 32 at the intersection of the stem portion and the corresponding shelf portion 14. As shown at 34 in FIG. 2, somewhat irregular surface remains on the shelf portion 14 of each terminal when it is separated from its corresponding stem. However, for purposes of illustration the surface 34 is greatly exaggerated and the shelf portion 14 remains substantially of planar configuration. Thus, the terminals 6 are initially in spaced relationship along the carrier strip 30 for ease in collective handling thereof. However, as shown in the FIGURE, each individual terminal may be advantageously handled, upon each terminal being frangibly separated from its corresponding stem 26 and inserted into a corresponding aperture 4 of the substrate 2. In addition, a plurality of terminals may be inserted in the corresponding substrate apertures 4, and the carrier strip subsequently separated from the inserted terminals.

Figure 2:
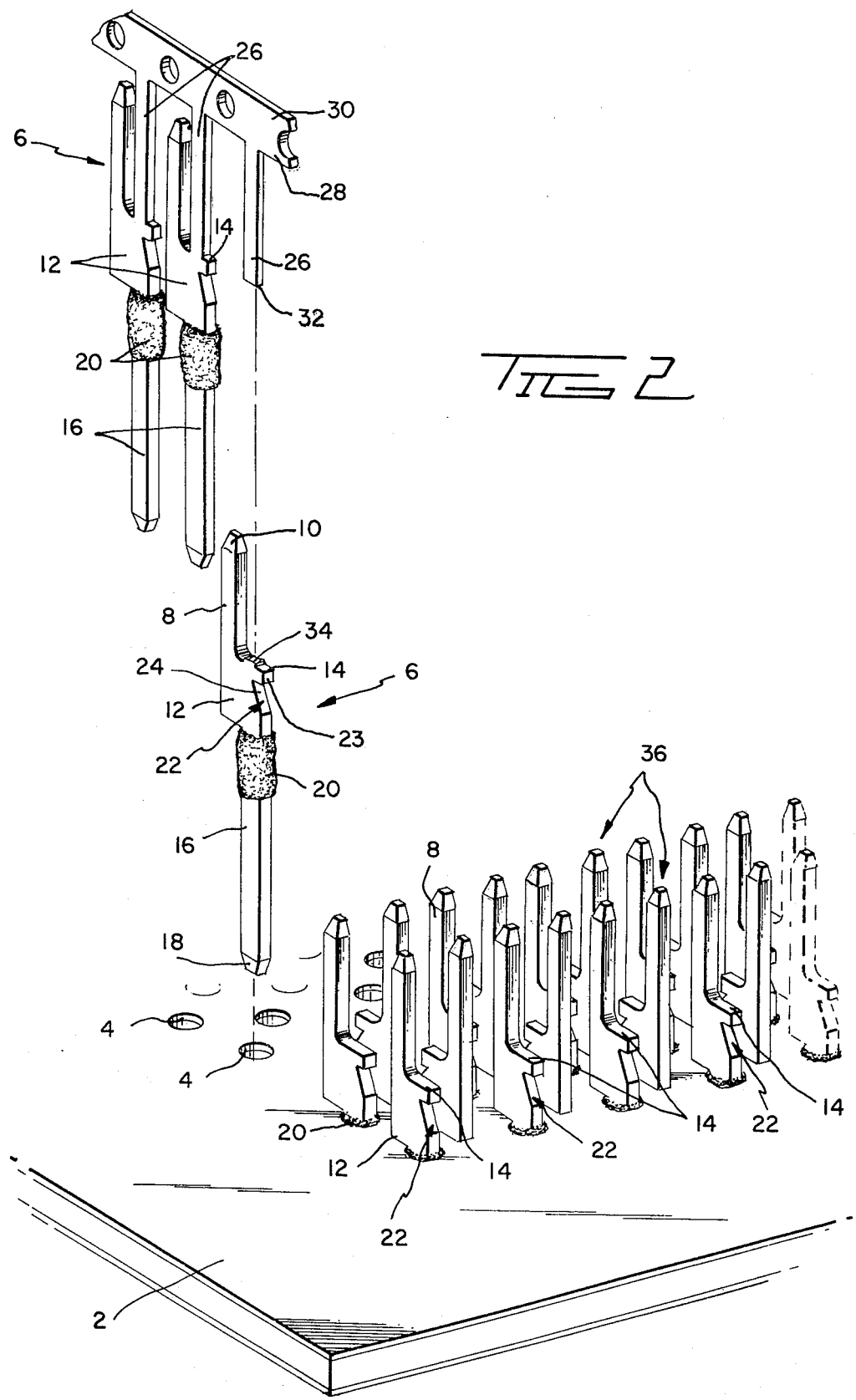
FIG. 2 is a fragmentary perspective, with parts illustrated in exploded configuration, illustrating a plurality of electrical terminals according to the present invention, some of which are mounted to a substrate and additional ones of which are connected by frangible stem portions to a carrier strip.

As shown in FIG. 2, a plurality of terminals 6 are thereby received in corresponding apertures 4 and arranged in a plurality of rows or regular arrays 36. The terminals are fixedly mounted to the substrate 2 by reflowing the solder bands 20 thereof to form rigid mechanical and electrical bonds between the substrate and the terminals, according to standard accepted reflow soldering techniques. According to the present invention, the shelf portions 14 of selected terminals of a row are in aligned, generally coplanar, relationship for a purpose to be hereinafter described.

With more particular reference to FIGS. 1, 3 and 4, the insulation housings for the terminals arranged in the arrays 36 will be described in detail. Each housing is generally indicated at 38 and includes a generally rectangular shroud portion, defined by a pair of parallel opposed and spaced elongated sidewalls 40 and 42 and a pair of parallel spaced endwalls 44 and 46. Together the sidewalls 40 and 42 and the endwalls 44 and 46 define therebetween a single rectangular receptacle opening extending entirely through the vertical dimension of the housing 38. The sidewall 42 is provided with an interior horizontal projection, or projecting flange or lip 42', extending the entire distance between the endwalls 44 and 46. In similar fashion, the sidewall 40 is provided with a horizontal projection, interior flange or lip 40' extending between the endwalls 44 and 46. As further shown in FIGS. 3 and 4, taken in conjunction with FIG. 5, the endwall 44 is provided with a generally vertically projecting elongated card guide channel generally indicated at 48. Three sides of the channel 48 are provided with respective recess portions 50, 52 and 54 which communicate with one another and provide a reduced neck configuration 56 at the intersection of the channel 48 with the endwall 44. The neck portion is laterally offset from the longitudinal axis of the channel portion. The channel portion 48 is additionally provided with a longitudinal channel groove 58 extending along the longitudinal length of the channel 48 and in communication with the substantially recessed portion 50. The free end 60 of the channel 48 is provided with a flared opening 62 in communication with the channel portion 58. A pair of spaced projecting bosses 64 are each provided on either side of the opening 62 and project vertically from the free end 60.

In similar fashion, the endwall 46 has vertically projecting therefrom an elongated card guide channel 48' of similar construction to the channel 48. Thus a reduced offset neck portion 56' is provided at the intersection of the channel 48' and the endwall 46, and is of a configuration determined by the recessed portions 50', 52', and 54' which correspond to the recessed portions 50, 52 and 54. A channel groove 58' is in parallel opposed relationship with respect to the channel groove 58, and further is in communication with a flared opening 62' provided in an end 60' of the channel 48'. A pair of bosses 64' are provided on the end 60' which correspond to the bosses 64.

In operation, reference will be made to FIGS. 1 and 5, wherein the housing 38 is provided over selected arrays of the terminals 6. The inner flange or lip portions 40' and 42' of the housing sidewalls 40 and 42, respectively, latchingly register within the aligned notch portions 22 of the selected terminals 6. The housing 38 is fabricated from a generally resilient plastic or other resilient electrical insulation material, thereby permitting resilient flexing of of the sidewalls 40 and 42 and enabling the lips 40' and 42' to resiliently latch into registration within the notch portions 22. All the terminals of a selected array are received into the single opening of a corresponding housing, thereby eliminating interior webs of the housing and contributing to the economy of the invention. Accordingly, the housing 38 is resiliently latched to the terminals 6 which in turn are fixed to the substrate 2. The housing 38 is advantageously mounted in fixed position with respect to the substrate 2 without a need for a direct mechanical attachment therebetween. Accordingly the housing may be made of low cost thin-wall resilient construction, whereas if a direct mechanical attachment were required to the substrate 2 of a corresponding rigid construction of the housing 38 would be required. That the housing is not directly attached to the substrate allows it to be readily removed merely by resiliently flexing the sidewalls 40 and 42 away from each other to disengage the portions 40' and 42' from engagement with the notch portions 22 of the terminals 6.

As a further feature of the invention, reference is made to FIG. 1 wherein the corresponding card guide channels 48 and 48' of each housing 38 slidably receives the opposed side margins of a card 66. In practice, a card 66 is slidably inserted between the card guide channels 48 and 48', with a plurality of electrically conducting paths 68 on the surface of the card being brought into electrical contact with corresponding electrical terminals 6 contained within the corresponding housing 38. The edge of the card is brought into registration on the aligned shelf portions of the corresponding terminals. It is imperative that the cart 66 be freely insertable and removed from the card guide channels without binding. The reduced neck portions 56 and 56' act as resiliently deformable hinges to allow the card guide channels 48 and 48' to flex resiliently in cantilever fashion and thereby relieve the binding stresses occasioned by insertion or removal of the cart 66. Thus if a tendency towards binding of the card 66 is experienced, the card guide channels 48 and 48' will flex individually to relieve the tendency toward binding and readily permit insertion or withdrawal of the card. In addition, the resilient cantilever action is also advantageous in that it enables alignment of the channels 48 and 48' when the card is initially inserted therebetween. To prevent twisting of the individual card guide channels 48, the spaced bosses 64 are received in corresponding spaced apertures 70 of a rigid rail 72. Thus the bosses 64 provide a two-point support for the end of each corresponding channel 48, to prevent twisting thereof. In similar fashion, the bosses 64' are received in corresponding apertures of a rail 72' similar in configuration to the rail 72. The bosses 64' thereby provide two-point supports for corresponding ends 60' of corresponding channels 48', thereby preventing twisting of the channels. Thus, the channels 48 and 48' are supported each at two points to a common rail, with twisting of each individual channel thereby prevented.

Referring again to the drawings, there is shown in FIG. 6 generally at 101 a plurality of conducting post-type electrical contacts having a generally enlarged rectangular elongated medial portion 102 and a depending reduced rectangular elongated post or post portion 104 integral with and depending from the medial portion 102. Each of the posts is provided with an encircling band of solder 108 adhered thereto. As shown, the band is adjacent to the tapered portion 106 of the corresponding post, however it may be desirably located selectively along any medial portion of the post portion 104. A solder band 108 is advantageously applied to each of the posts in accordance with the teachings of application Ser. No. 153,315, filed June 15, 1972.

With reference yet to FIG. 6, the medial portion 102 of each of the contacts 101 includes a pair of spaced latching tabs 109 and depends from and is integral with a pair of leaf springs or fingers 1010. The leaf springs 1010 of each contact are reversely bent into a generally concavo-convex configuration and depend from a single stem 1012 projecting laterally of the longitudinal axis of an elongated carrier strip 1014. The carrier strip 1014 is of the ladder type with each contact depending from a separate laterally projecting stem 1012. As shown in the FIGURE, the contacts are notably absent any interconnecting portions therebetween. Accordingly, the contacts are laterally unsupported and free to move relative to one another. Additionally, the contacts are free to deflect substantially with respect to the carrier strip 1014 and stems 1012 without overstressing the stock material or producing permanent bends in either the contacts or the carrier strip. In addition, the carrier strip 1014 maintains the posts in mutual alignment and locates them precisely on desired center spacings.

Yet with reference to FIG. 6, there is shown a portion of a substrate 1016 provided with a first row of spaced apertures 1018 on center spacings corresponding to the center spacings of the row of posts 101 depending from the common carrier strip 1014. The holes 1018 are provided with linings comprising a layer of conducting material, such as a solder or plated metal. Selected linings of selected apertures 1018 may be electrically connected to corresponding plated electrical paths, some of which are shown at 1020, carried on the surface of the substrate 1016. Accordingly, the substrate 1016 may comprise a printed circuit board or card with plating or solder lined apertures electrically associated with circuit paths on the substrate.

Heretofore, post-type contacts were first inserted within sockets or partitions defining channels in a connector housing fabricated from an electrical insulation material. This was found to be advantageous since the connector housing retained the contacts in proper alignment and electrically insulated from one another. As a further feature, the contacts were lockingly latched in the connector housing, enabling the pins to be forcibly inserted within respective apertures of a substrate without dislodging them from the connector housing. An exemplary locking feature is identified by the Trademark TERMI-TWIST, the property of AMP Incorporated, Harrisburg, Pennsylvania. Generally, insertion and latching of individual contacts within a connector housing, was followed by inserting the contacts through an apertured substrate and mechanically securing the connector housing to the substrate with fasteners. This sequence of assembly steps required substantial expenditures of assembly time. In addition, individual electrical connection of the posts to circuit paths of the substrate necessitated further expenditures of assembly time, since each connection was made individually by hand soldering or the application of a solder ring applied individually on each of the posts.

The heretofore required assembly time can be substantially reduced by practice according to the present invention as will be explained hereinafter in detail. More specifically, as shown in FIG. 6, the carrier strip 1014 provides a first row of contacts 101. A selected number of the contacts are separated from the remaining contacts on the carrier strip portion 1022 as by severing the carrier strip at 1024. The selected number of posts are then simultaneously inserted into corresponding apertures 1018 of the substrate 1016 by an automatic assembly machine such as that described in patent application Ser. No. 255,239, filed May 19, 1972, and now U.S. Pat. No. 3,800,416. This is accomplished most readily since the center spacings of the selected plurality of contacts are equal to the center spacings of the corresponding apertures 1018. Since the contacts 101 are substantially unsupported along their lengths, they are free to move without bending or otherwise overstressing. Accordingly, they can be substantially moved with respect to one another to guide each individual post into registration with an aperture 1018 by combing apparatus or other guiding apparatus not shown.

Illustrated in FIG. 7, with the posts 101 having been inserted into corresponding apertures 1018, the post portions 104 of the selected plurality of contacts are gripped by cooperating jaws exemplary ones of which are shown at 1026. Such jaws may form a part of the automatic assembly machine utilized to insert the contacts. As shown in the FIGURE, opposing pairs of the jaws 1026 pivot toward one another as generally indicated by the arrow 1028. Additionally, the jaws grip individual post portions 104 and traverse generally in the direction of the arrow 1030. This longitudinally pulls the contacts and seats the tapered portions 106 of the contacts in registration, generally against corresponding ends of the apertures 1018 and also generally at one planar surface of the substrate 1016. Since the seated contacts are still attached to their severed off portion of the carrier strip, they are supported by the attached portion of the carrier strip 1014 as well as the apertures 1018 in a desired alignment and on precisely located center spacings. Thus each of the selected plurality of contacts is physically supported on the substrate at two spaced points.

With more particular reference to FIGS. 6–9 of the drawings, additional features of and advantages of the present invention will be disclosed in detail. In FIGS. 6 and 7, there is shown a second row of contacts 101 depending from corresponding stem portions 1012' of a ladder type carrier strip portion 1014' severed as at 1024' from the remainder of the carrier strip. The second row of contacts are inserted and seated within a second row of apertures 1018' as disclosed with regard to the first tow of contacts. As a result, as shown in FIG. 7, two rows each containing a selected plurality of contactts 101 are similarly supported on a substrate 1016. Each row remains attached to its corresponding carrier strip portion 1014 or 1014'. Each contact has its corresponding tapered portion 106 and 106' seated at one surface of the substrate 1016 and at one end of a corresponding aperture 1018 or 1018'. Each contact is thus positioned such that its respective pairs of tabs 109 or 109' are located generally in spaced relationship above the one surface of the substrate 1016, with all of the tabs within a corresponding row of contacts being in mutual alignment. It is a further requirement that the contacts of one row be supported on the substrate in back-to-back relationship with respect to the contacts of the other row. As a result, the tabs 109 and 109' project generally outwardly of the space defined between the spaced rows of contacts.

With the first and second rows of contacts thus seated in the corresponding apertures 1018, the individual solder bands 108 and 108' of the posts will be disposed inside corresponding apertures 1018 and 1018'. Accordingly, each solder band 108 is immediately adjacent to and radially disposed within an aperture conductive lining.

As shown in FIG. 8, the conductive linings are indicated at 1019. The linings of the apertures 1018 are electrically connected to circuit paths 1020 on both planar surfaces of the substrate. The linings 1019' of the apertures 1018' are connected electrically to circuit paths 1020' also on both surfaces of the substrate. Only exemplary first and second rows of contacts are shown assembled to the substrate 1016. It is however understood that any desired number of contacts may be provided on the substrate 1016 and that the circuit paths 1020 and 1020' may have any configuration other than that shown. In addition, circuit paths can be provided only on one planar surface of the substrate as desired. The preferred embodiment thus far described is well adapted for simultaneous insertion of a relatively large number of contacts on a substrate. Since a plurality of contacts according to the present invention can be inserted simultaneously rather than individually, the larger the number of contacts required per substrate, the greater will be the savings of assembly time realized over the procedure in the prior arts of individually inserting contacts in a substrate or first within a predetermined connector housing and then to a substrate.

As shown in FIG. 8, when all of the desired contacts are seated on the substrate 1016 as described, the solder bands thereof are heated such as by dipping the post portions 104 and 104' in a heated oil bath. The solder bands will thus reflow to produce a solder joint generally encircling a corresponding post portion 104 and electrically and mechanically connecting the post to a corresponding aperture lining 1019 and 1019'. Such a joint also results in the reflowed solder forming a fillet 1032 at each end of a corresponding aperture and completely encircling and adhered to a corresponding post within the aperture.

Since the solder bands are initially located within the lined apertures prior to reflow of the solder, an advantage is realized over hand soldering or the application of solder rings to individual posts as was practiced in the prior art. More specifically, hand soldering or the addition of solder rings heretofore required individual handling of each post-type contact after insertion in the substrate. In addition, the prior art soldering procedures required a sufficient mass of molten solder be flowed into and fill the apertures in order to assure sound solder joints. Such a procedure required operator skill, the expenditures of considerable assembly time to produce the solder flow, and a thorough inspection to assure that sufficient solder mass was flowed into the aperture to produce a sound mechanical and electrical joint.

According to the present invention, all the solder bands of all the posts are positioned correctly within corresponding apertures merely upon insertion of the posts and merely upon selecting the locations of the solder bands along the lengths of the posts to insure that the bands are located within the apertures when the posts are seated on the substrate. Accordingly, the present invention eliminates the need heretofore required in the prior art for wicking the solder into substrate apertures or otherwise insuring that the apertures contain solder to produce desired solder joints.

The present invention also insures that the solder bands contain sufficient mass, such that upon reflow, solder completely fills the apertures without solder voids, with additional solder mass being available to form the fillets at each end of every aperture. The solder mass is controlled by selection of the band width of each solder band 108. Accordingly, a wider band width produces more solder mass upon reflow than a narrower band width. Accordingly it is desirable that the band widths of the solder bands 108 be larger than the thickness of the substrate (and consequently greater than the lengths of the substrate apertures) as recognized in U.S. patent application Ser. No. 153,315, filed June 15, 1971.

The solder bands, upon reflow, completely fill the apertures in which the bands are located and produce the fillets at each end of the apertures. Since the solder bands are automatically located in the apertures and sufficient solder mass is available upon reflow, mechanically and electrically sound joints are produced with less expenditure of time and with a greater reliability than heretofore available in the prior art. As a further advantage of the present invention, the solder strips are desirably located within the apertures automatically upon seating the contacts within the substrate, further reducing the assembly time which would otherwise be required by application of solder subsequent to assembly of the contacts within the substrate.

As shown with reference to FIG. 9, after reflow of the solder bands and cooling of the resultant solder joints, the exemplary first and second rows of posts are rigidly joined to the substrate 1016 and mechanically and electrically joined to the corresponding circuit paths 1020 and 1020'. The carrier strips 1014 and 1014' together with the stem portions 1012 and 1012' may be severed from the spring portions 1010 and 1010' of the contacts. As shown in FIG. 8, the intersections of the contacts and respective stem portions 1012 and 1012' include scored portions 1036 and 1036' to readily permit severing off and separation of the stem portions 1012 and 1012' from the finger portions 1010 and 1010'. As shown in FIG. 9, the carrier strips 1014 and 1014' may be removed prior to enclosing the exemplary first and second rows of contacts within a connector housing, a portion of which is shown at 1038. The connector housing 1038 is fabricated from an electrical insulation material and includes a pair of generally stiffly flexible sidewalls 1040 and 1040' connected by a pair of endwalls, one of which is shown at 1042. In accordance with one of the objects of the present invention, the interior structure of the connector housing 1038 is of relatively simple construction and is devoid of sockets or multiple partitions heretofore required in the prior art for aligning and separating individual post-type contacts from one another. Instead, the sidewall 1040 includes a generally elongated projection 1044, with a similar projection 1044' provided on the other sidewall 1040'. As shown in FIGS. 8 and 9, the housing 1038 is readily assembled in enclosing relationship over the exemplary rows of contacts 101. Each of the projections 1044 and 1044' includes an inclined sidewall which engages and readily slidably traverses over corresponding rows of contacts 101. The sidewalls 1040 and 1040' are stiffly flexible to the resiliently deformed outwardly from each other, thereby allowing the connector to resiliently expand and permit the slidable traverse of the projection 1044 and 1044' over the corresponding contacts as the connector is vertically assembled over the contacts. As shown in FIG. 8, when the projection 1044 is fully slidably traversed over the tabs 109 of the first row of contacts and when the projection 1044' is fully slidably traversed over the tabs 109' of the second row of contacts, the housing 1038 will be seated on the planar surface of the substrate 1016. The housing sidewalls 1040 and 1040' will then return resiliently to their original configurations. Thus, as shown in FIG. 8, the sidewall 1040 will abut against the vertical elongated edges of the tabs 109, thereby laterally supporting the first row of contacts 101. Similarly, the sidewall 1040' will impinge against the vertical side edges of the tabs 109' to mechanically laterally support the second row of contacts. In addition, the projection 1044 latchably engages against the ends of the tabs 109 which are aligned and adjacent the planar surface of the substrate 1016. Similarly, the projection 1044' latchably engages against the aligned ends of the tabs 109' which tab ends are adjacent to the planar surface of the substrate 1016. Accordingly, the contacts seat the connector housing 1038 and anchor it in fixed location on the substrate 10106. The connector housing may be assembled over the contact either subsequent to removal of the carrier strip portions 1014 and 1014' as shown in FIG. 9, or prior to removal of the carrier strip portions as shown in FIG. 8. In all cases however the carrier strip portions are maintained on the respective rows of contacts to maintain them in alignment and on desired center spacings until the solder bands of the contacts are reflowed to rigidly join them on the substrate.

As shown in FIGS. 8 and 9, the housing 1038 includes a pair of internal, parallel relatively closely spaced card guides 1046 and 1046', supported on the sidewalls 1040 and 1040', respectively. According to well known procedures, a card or board having printed circuit paths can be removably mounted in the housing and supported by the card guides 1036 and 1036'. As shown in FIG. 8, the card guide is readily insertable between the exemplary first and second rows of contacts with the opposed fingers 1010 and 1010' being angularly directed away from one another to provide a flared entryway which allows insertion of the card guides between the tows of contacts. The fingers 1010 are thereby positioned on the substrate and within the connector housing for electrical contact with selected circuit paths of the card or board. The post portions 104 depending from the substrate 1016 are suitable for receiving point-to-point wiring or for receiving additional substrates in attached relationship. Accordingly, the preferred embodiment described in conjunction with FIGS. 6–9 provides apparatus suitable for assembling and electrically connecting post-type contacts to a substrate and circuit paths on the substrate as well as a technique for assembling a connector housing to a substrate without a need for fasteners.

In a modification, a plurality of post-type contacts 1048 are shown in FIG. 10 with medial portions 1050 generally of elongated rectangular configuration having a pair of laterally projecting latching tabs in the form of barbs 1052. Each medial portion 1050 of the terminal is provided thereon with an encircling band of solder 1054 similar to a solder band 108 heretofore described. Each contact terminates in an elongated post portion 1056. In addition each terminal is provided with an enlarged rectangular portion 1058 generally adjacent to the one in spaced relationship from the spaced barbs 1052. The portion 1058 terminates in an integral pair of concavo-convex fingers 1060 frangibly attached to a stem 1062 of a ladder type carrier strip 1064. Yet with reference to FIG. 10, a second row of contacts are illustrated with primed numeral designations for parts similar to the first row of contacts. The second row of contacts are attached to a ladder type carrier strip 1064''. A selected plurality of contacts of each row are separated from the remaining contacts on the carrier strip by severing the carrier strip at 1066 or 1066'.

As shown in FIG. 10, a connector housing 1068 is located with a first row of apertures 1070 and a second row of apertures 1070' in alignment with corresponding apertures of a substrate 1072. More particularly, the substrate 1072 includes a row of first apertures, exemplary ones of which are shown at 1074, and a second row of apertures, exemplary ones of which are shown at 1074'. As heretofore explained, the apertures 1074 and 1074' are lined with a conducting layer which is electrically connected to circuit paths 1076 and 1076' respectively. During assembly, the first and second exemplary rows of contacts 1048 are inserted by machine process simultaneously into the connector housing 1068 of the substrate 1072. More particularly, the first row of contacts are simultaneously inserted into the aligned apertures 1070 and 1074 of the connector housing and substrate, respectively. In similar fashion, the second row of contacts 1048 are inserted simultaneously into the apertures 1070' and 1074' of the connector block and substrate, respectively. The completed assembly is illustrated in FIGS. 11 and 13. With reference to the FIGURES, the post portion 1056 and 1056' protrude from the substrate 1072 and are pulled by a pulling and gripping apparatus similar to the jaws 1026 in order to seat the enlarged rectangular portion 1058 against a bottom wall 1078 of the connector housing 1068. The barbs 1052 and 1052' are forcibly inserted into the respective connector block apertures 1070 and 1070' and bite into the bottom wall 1078 in which the apertures 1070 and 1070' are defined in order to prevent removal of the contacts. The barbs thus latch the connector housing in anchored location on the substrate. In addition, the solder bands 1054 and 1054' are disposed within the conducting substrate aperture linings, some of which are shown at 1080 in FIG. 13. When all the desired contacts together with their respective connector housings are thus located on the substrate 1072, all the solder bands of the contacts are reflowed as heretofore described, thus producing structurally and electrically sound solder joints. More particularly, such solder joints are illustrated in FIG. 13 with exemplary solder bands 1054' being reflowed and of sufficient mass of solder to join the entire length of the exemplary conducting linings 1080 and with sufficient solder mass to form solder fillets 1082 at each end of the conducting linings, thereby electrically and mechanically joining exemplary contacts to the circuit paths 1076'. As also shown in FIG. 13, taken in conjunction with FIGS. 10 and 11, the connector housing 1068 is provided with a plurality of opposed pairs of card guides 1084 similar to the card guides 1046 and 1046' heretofore described. In the preferred embodiment as shown in FIGS. 10, 11 and 13, the card guides are provided between adjacent contacts of each row further defining interior partitions separating adjacent contacts. Such partitions are not necessary to align and separate the contacts from one another, since the carrier strips 1064 and 1064' remain attached to the first and second rows of contacts until the solder bands thereof are reflowed to permanently join the contacts to the substrate 1072. Accordingly, the attached carrier strip mechanically supports the contacts in alignment and on desired center spacings, while the aligned apertures of the connector housing and substrate mechanically support the contacts at another point and on desired center spacings until the solder bands of the contacts are reflowed to rigidly join the contacts to the substrate and the circuit paths. When all the contacts are thus joined to the substrate, the carrier strips 1064 and 1064' may be removed. Accordingly, in the preferred embodiment of FIGS. 10, 11 and 13, a connector block and a selected plurality of post-type contacts are simultaneously assembled to a substrate, with the posts being electrically and mechanically joined to the substrate 1072. The protruding post portions 1056 and 1056' are suitable for point-to-point wiring on additional stacked substrates.

With reference to FIG. 12, a modification of the preferred embodiment as shown in FIGS. 10, 11 and 13, is illustrated. The same contacts 1048 are illustrated as being secured mechanically and electrically to the substrate 1078. However, the exemplary contacts are contained within a modified electrically insulating connector housing indicated at 1068'. The contacts are seated against the bottom wall 1078 of the modified connector housing 1060' in accordance with the description of the preferred embodiment of FIGS. 10, 11 and 13. However, the modified housing 1068' is devoid of individual partitions between adjacent contacts, whereupon reliance is placed upon the attached carrier strips 1064 and 1064' to maintain the first and second rows of contacts in alignment and on desired center spacings, thereby eliminating the need for individual partitions in the connector housing 1068'. After the contacts are secured to the substrate by reflowing the solder bands of the contacts, the carrier strip may be removed.

Other modifications and embodiments are immediately discernable from the preferred embodiments disclosed. For example, it is contemplated that not all of the substrate apertures will be lined with conductive material. In addition, not all of the substrate apertures will be associated electrically with a circuit path. Reflowing of solder bands contained on post-type contacts received in such apertures will form the required solder fillets and fill the clearance space between such apertures and the posts received therein. This will result in at least a sound mechanical connection of the posts to the substrate which maintains the posts in fixed assembled location on the substrate without a need for additional mechanical support for the posts.

With more particular reference to the drawings, there is shown in FIG. 14 generally at 210, the combination of a pair of substrates or printed circuit boards 202 each having a plurality of plated electrical conductor paths carried thereon, exemplary ones of which are shown at 204. With reference to FIGS. 14, 16 and 17 each of the substrates 202 is fabricated in the usual manner by using drill bits 206 to provide apertures therethrough. To properly align the apertures 208 of different boards 202, the boards are placed in stacked relationship as shown in FIG. 17 such that the apertures are simultaneously drilled in perfect alignment. Obviously a plurality of boards or a single board may be so drilled at one time. In any case, a back-up substrate 2010 must be utilized against a board being drilled to prevent the drill bits 206 from tearing through the surface 2012 of a board being drilled. Use of the back-up substrate thus assures cleanly drilled apertures 208 through the substrates or boards 202. After the substrates 202 are drilled, they are plated to provide the electrical paths 204 according to well known printed circuit board fabrication techniques. The apertures 208 are lined with plating 2014 simultaneously as the paths 204 are plated on the substrates. As a result, plating lined apertures typically intercept selectively the plated paths 204, with the plating lining 2014 in electrical contact with the paths 204.

As shown in FIGS. 14 and 17, it is desirable to mount a plurality of elongated electrical contacts to a single printed circuit board or substrate 202, or alternatively, to a plurality of printed circuit boards 202. A plurality of such contacts are shown at 2016. Each of the contacts 2016 depends in cantilever mounted fashion from a common carrier strip 2020, with an integral bifurcated end portion 2018 initially frangibly securing a contact to the carrier strip 2020. As shown in FIG. 14, a row of contacts 2016 are located on the common carrier strip portion 2020 on center spacings equal to the center spacings between the plating lined apertures 208 of the printed circuit board or boards 202. To assemble the contacts in the board or boards 202, a selected carrier strip portion 2020 is severed from the remainder of an excessively long carrier strip in order to separate a selected number of contacts 2016 and sever them from the remainder of the carrier strip. The selected number of contacts are then simultaneously inserted into a corresponding row of plating lined apertures 208, according to the techniques disclosed in the copending application Serial No. 193,366.

As shown in FIGS. 15 and 16, each of the contacts is characterized by the described bifurcated end portion 2018, a medial, elongated reduced rectangular portion 2022 and a reduced elongated rectangular portion 2024. The medial portion 2022 is provided thereon with a mass of solder distributed thereon and selectively adhered thereto in a band of controlled band width according to the teachings of copending application Ser. No. 153,315. Each contact includes a first inverted shoulder portion 2028 between the medial portion 2022 and the bifurcated end portion 2018. The solder band 2026 is precisely located on the medial portion 2022 in desired relationship with respect to the shoulder portion 2028 for a purpose to be described. The contact is further characterized by a second inverted shoulder portion 2030 longitudinally spaced along the elongated contact from the first shoulder portion 2028 and the solder band 2026.

As shown in FIG. 16, with the row of contacts inserted in the plating lined apertures 208 of a single board, or a plurality of boards 202, the inverted shoulder portion 2028 of each contact will seat against a plated path 204, or alternatively against a surface of a board 202, if the plated path 204 is absent, in order to precisely position each contact in mounted position with respect to a board 202. Since all of the contacts 2016 are identical, the shoulder inverted portions 2028 thereof uniformly position the row of contacts in desired positions. If a plurality of boards are utilized as shown in FIG. 16, only the spacing between adjacent boards needs to be controlled to assure uniform mounting of all the contacts in proper position with respect to all of the boards being used. Thus, all the mounted contacts can be uniformly positioned by their inverted shoulder portions 2028 with respect to a first board 202. If additional boards are utilized, only the spacings between the additional boards need be controlled to assure uniform positioning of the contacts, not only to the first board, but also to such additional boards.

The inverted shoulder 2028 is further utilized to perform another important function. Since the solder band 2026 is selectively positioned on each contact with respect to a shoulder portion 2028, the shoulder portion 2028 positively locates the solder band 2026 internally of the plating lined apertures 208 of a board or plurality of boards 202. It is desirable that the solder band 2026 be located substantially internally of a plating lined aperture 208 receiving a contact 2016. More specifically it is desirable that the solder band width be sufficiently long so as to extend entirely through a plating lined aperture from one open end of the plating lined aperture to the other open end of the plating lined aperture. Thus, the inverted shoulder 2028 serves to positively position the solder band 2026 of each contact such that it extends completely internally of the entire elongated length of a plating lined aperture 208. Thus, the inverted shoulder 2028 of each contact positively locates each contact in position on a printed circuit board, limits insertion of each contact in a printed circuit board, and positively positions the solder band interiorly of a plating lined aperture of the board into which the contact is inserted. If more than one printed circuit board is utilized, only the spacing between adjacent additional boards need be controlled to insure the desired location of the contacts and their corresponding solder stripes internally of the plating lined holes.

According to a feature of the present invention when all the desired number of contacts are mounted in corresponding plating lined apertures of the printed circuit board or boards, all of the solder bands of the contacts can be simultaneously heated to reduce the solder bands to a molten state and to reflow the solder bands to adhere to the contacts and the plating lining 2014 of the apertures receiving the contacts. Such reflow technique is disclosed in copending application Ser. No. 153,315, and Ser. No. 193,366. A more specific description of a reflowing operation will be made with reference to FIG. 18, wherein there is shown a pair of boards 202, the plating lined apertures 208 of which receive corresponding contacts 2016 in the manner as hereinbefore described. If more than one board is utilized, spacers 2032 are provided between adjacent boards and the assembly of plural boards are clamped together with the spacers 2032 therebetween. The spacers 2032 may comprise land portions protruding from one of the boards 202 as shown in FIG. 18. Alternatively, the spacers 2032 may include a sheet of dielectric material or a webbing of woven, latticed, or apertured dielectric material. The assembly as shown in FIG. 18 also may include the back-up substrate 2010, the apertures of which are counter-bored at 2034 and positioned by spacers 2036 to receive the corresponding end portions 2024 of the contacts, namely the end portions opposite to the end portions 2018 which are yet maintained attached to the common carrier strip 2020. More specifically, each row of plating lined apertures 208 of each of the boards receives a corresponding row of contacts 2016 inserted therein. A common carrier strip portion 2020 remains yet attached to the individual end portions 2018 of the corresponding contacts in each row. The carrier strip retains the contact ends in desired alignment during reflow of the solder. The medial portions of the contacts are maintained in desired alignment since they are received in the corresponding plating lined apertures of the board or boards 202. The free ends of the contacts 2024 are received in the apertures of an auxiliary substrate or the back-up substrate 2010. Since the back-up substrate apertures were drilled simultaneously with the board or boards shown in FIG. 17, the apertures of the auxiliary substrate are on the same center spacings as are the plating lined apertures of the printed circuit board or boards. Thus while the solder bands are heated and reflowed, the free ends of the contacts are maintained in desired alignment by the auxiliary substrate.

As shown in FIG. 19, an exemplary method of reflowing the solder bands is illustrated. The preferred embodiment of FIG. 18 is shown immersed in a container 2038 containing a fluid 2040 at elevated temperature. By experimentation it was found desirable that the band width of each solder band 2026 be sufficient not only to extend the entire length of the plating 2014 when received in the corresponding aperture 208 of a board, but also be sufficiently long to protrude from each open end of a plating lined aperture 208. Such a protruding relationship is desirable during reflow, since the fluid 2040 is allowed to enter in the spaces between adjacent boards 202 and apply heat directly to the solder band portions which protrude from each open end of the plating lined apertures. The applied heat reduces the solder to a molten state. The capillary action is provided by the clearance between each contact medial portion 2022 and the plating 2014 of a corresponding aperture 208 receiving a contact. Such capillary action forcibly wicks the molten solder into such clearance, thereby causing the solder to completely fill the clearance. The fact that the solder bands 2026 are initially positioned along the entire internal length of the plating lined apertures assures that the clearances become completely filled with solder upon reflow. The initial presence of the solder within the plating lined apertures also alleviates the need for having to rely entirely upon a wicking action to draw in sufficient masses of solder to completely fill the clearances between the contacts and the plating 14. Also the initial presence of solder in the plating lined apertures minimizes the clearance between the contacts and the plating 2014 thus limiting the volume of air or gases in the clearances which would have to be displaced by additional masses of solder which become wicked into the clearances. By experiment, it was found that by pre-disposing the solder internally of the plating lined apertures before reflow, the gases are allowed to escape during reflow, advantageously allowing the solder to wick into and fill the clearances between the contacts and the plating 2014 without trapping gases. Upon cooling, the solder forms solidified, void-free solder joints extending completely the lengths of the plating lined apertures from one open end thereof to the other. Such a joint is more particularly shown in FIG. 20. As a further feature, the solder bands 2026 are of sufficient band width initially distributed along the length of the contacts in a selected broadband width as shown in FIG. 20 at 2042. This not only allows the solder band to protrude from each open end of a plating lined aperture for direct contact by the fluid 2040 but also provides sufficient masses of solder upon each contact that upon reflow the masses of solder are sufficient to completely fill the clearances between the contacts and the plating 2014. Additional masses of solder in excess of that required to fill the clearances will tend to agglomerate and form solder fillets 2044 completely encircling corresponding contacts immediately adjacent to each open end of a plating lined aperture 208. Although applicants do not wish to be bound by any particular theory of operation, it has been observed that such agglomeration accumulates at each open end of the plating lined apertures 208 because of the wicking action as described. More particularly, it is the wicking action which causes the solder to wick and completely fill the clearances between contacts and plating 2014. It is also the wicking action which tends to draw the agglomerated additional masses of solder toward each open end of the plating lined apertures 208. Thus, the agglomerated masses of reflow solder tend to follow the wicked masses of solder into the clearances. However, when the clearances are entirely filled with reflowed solder, the agglomerated masses of solder in excess of that required to fill the clearances will not wick into the clearances but are forced to accumulate at each open end of the plating lined apertures 208 and form solder fillets 2044 advantageously encircling the corresponding contacts received in the apertures 208. Thus, as shown in FIG. 20, the tendency of the solder to reflow toward the open ends of the apertures 208 prevents the solder from flowing off, or along, the contacts. The initial band width of the solder, illustrated at 2042 in FIG. 20, becomes substantially shrunk, due to the described reflow and wicking and agglomerating, leaving the remainder of the contacts substantially free of excess solder. The contacts thereby are clean and devoid of solder contaminants, allowing the contacts to retain their original characteristic electrical impedance as well as other original electrical characteristics possessed before application of the solder bands thereto.

Thus upon removal of the assembly from the fluid bath as shown in FIG. 19, the reflowed solder bands are cooled to form solidified void-free solder joints electrically and mechanically connecting the contacts 2016 to the plating lined apertures of a board or boards. Thus either a single board may be fabricated according to the reflow technique as described, or a plurality of boards may be fabricated in stacked relationship according to the same technique. As a further advantage, since the solder bands are pre-disposed onto the posts prior to insertion, such eliminates the necessity of hand wiring individual posts or, alternatively, placing solder donuts on each post once they are inserted in the board. In addition, since the solder bands are pre-disposed internally of the plating lined apertures, more solder mass is available to form the solder joints than as could be heretofore accomplished by hand soldering or by the application of solder donuts.

Another salient feature of the present invention resides in fabricating a multi-layer printed circuit board. Generally, a multi-layer board includes a plurality of stacked planes with circuit paths being carried in a plurality of such planes. Interconnections are required between the circuit paths of different planes. By fabricating the plated paths upon separate boards and placing them in stacked relationship according to the present invention, the interconnections between the circuit paths of different planes may be accomplished by reflowed solder bands, which electrically and mechanically connect contacts, carrying the solder bands between the plated paths in a plurality of planes. Thus, with reference to FIG 20, the plurality of boards 202 are placed in stacked relationship with their circuit paths 204 carried thereon in different planes. Interconnection between the paths 204 of different planes is accomplished by the reflowed solder band 2026 carried by the contact 2016. Such reflowing is accomplished according to the operations as described above. In the typical multi-layer board however, the paths 204 of different planes must be separated by dielectric material to control the characteristic impedance of the paths 204. With the boards 202 stacked in relationship as shown, the clearance between the boards may be filled with a dielectric 2046 which provides electrical insulation between the circuit paths of the adjacent boards and encapsulates the plurality of stacked boards into a single multi-layer board structure. A preferred method of fabricating such board is described again with reference to FIG. 19. With the boards 202 assembled as shown in FIG. 19, the assembly is immersed in a fluid 2040 at elevated temperature to reflow the solder bands. A desirable fluid to use is a dielectric substance which, upon cooling, solidifies to fill the clearances between adjacent boards and provides an insulation layer 2046 as described. Such a desirable fluid was found to be CARBOWAX polyethylene glycol 6000, supplied by Union Carbide Company Incorporated. Such a material has a freezing range between 60° to 60°C and a flash point of 520°C. The material is also soluble in hot water. Thus, by using the fluidized polyethylene glycol to melt and reflow the solder bands 2026, the polyethylene glycol is allowed to seep into the clearances between adjacent stacked boards and apply heat by contacting the solder band protruding portions as described. When reflow is accomplished, the assembly is removed from the container 2038. Upon cooling the required solidified solder joints together with the solidified fillets 2044 are formed. Also as shown in FIG. 20, the polyethylene glycol will solidify in the clearances between the adjacent boards 202 to form the desired insulation between adjacent plated paths and to encapsulate the boards into a single multi-layer board structure. Generally, the clearances between adjacent boards serve as a capillary to retain fluid polyethylene glycol therebetween until it solidifies. However, as before explained, the spacer 2032 may comprise a solid or perforated sheet or web of dielectric which will aid in retaining the polyethylene glycol between adjacent boards 202.

With reference to FIGS. 14, 22, 13 and 24, a housing according to the present invention will be described in detail. The housing is generally shown at 2048 and includes a plurality of partitions integral with an interior portion of the sidewalls 2049 of the housing. Interiorly of the housing, the partitions 2050 of opposed sidewalls define clearance therebetween to receive therein a printed circuit card or board, a portion of which is shown at 2051 in FIG. 21. The board includes plated paths thereon for electrical contact with corresponding contacts 2016 mounted in the boards 202 and enclosed within the housing 2048. As shown, the contacts 2016 are arranged in two rows, with the partitions 2050 being disposed between adjacent contacts of a row to electrically isolate them one from the other. The housing includes an integral latch portion 2052 integral with one of the sidewalls 2049. Although only a single latch 2052 is shown, a plurality of such latches may be utilized but in spaced relationship on either sidewall 2049 of the housing 2048 to eliminate weakness in the sidewalls 2049. FIGS. 24 and 22 show the details of the latch interiorly of the housing. The latch portion is defined between a pair of slits 2053 defining the latch portion as a resilient cantilever beam integral with the sidewall 2049. One of the partitions 2050 extends substantially along the length of the cantilever beam as a strengthening rib. A protruding hook portion 2054 is defined on either side of the strengthening rib 2050. As shown with respect to FIGS. 22 and 23, when the housing is received over a plurality of contacts 2016, the hook portions 2054 will latch behind corresponding inverted shoulders 2028 precisely located in fixed positions spaced from the surface of one of the boards 202. As shown, each of the hook portions 2054 registers on one of a selected pair of contacts 2016 to which the housing 2048 is latchably secured thereby. Thus the contacts 2016 to which the housing is secured retains the housing in place encircling all of the contacts 2016 and mounts the housing in fixed position on the printed circuit board 202. A clearance 2056 is provided in the sidewall 2049 in communication with one of the slits 2053. Such clearance allows for the insertion of a pointed tool therein to engage and pry the latch portion in resilient cantilever fashion to disengage the hook portions 2054 from the selected contacts 2016 and allow removal of the housing. With the latch portion located in a sidewall of the housing, the end walls 2058 of the housing 2048 remain free to be located in closely spaced relationship with respect to another housing or an electrical component mounted on the circuit board 202, without interfering with the operation of prying the latch portion to permit removal of the housing as described. In addition, the housing end walls are free to permit their severing if necessary to permit additional close spacing to another housing or electrical component, without interfering with the latching operation or the prying operation to allow removal of the housing as described.

In one modification of the reflow operation, it is desirable to preheat the contacts 2016 prior to immersion of the assembly shown in FIG. 18. Thus, the ends of the contacts 2016 are initially immersed in the fluid 2040, thereby preheating the contacts 2016. Heat is transmitted along the preheated contacts to the medial portions. The solder bands are not reduced to a molten state during this preheating operation. However, once the contacts are preheated, the assembly is entirely immersed to reflow the solder. It was found by experiment that the time of immersion sufficient to reflow the solder was reduced if the contacts were first preheated.

Although preferred embodiments and modifications of the present invention have been specifically described and shown, other modifications and embodiments of the present invention are intended to be covered by the spirit and scope of the appended claims.

What is claimed as new and desired to be secured by Letters Patent of the United States is:

1. A method of fabricating a multi-layer printed circuit board, comprising the steps of: maintaining a plurality of separate printed circuit boards in spaced stacked relationship, providing a plurality of selected aligned plating lined holes in said plurality of boards, providing a plurality of electrically conducting elongated contacts with solidified solder bands adhered thereto, receiving said contacts together with said solder bands internally of corresponding plating lined holes provided in said boards to provide an assembly, maintaining the alignment of said contacts while preheating said contacts to an elevated temperature to reduce said solder bands to a molten state, maintaining said contacts in desired alignment while immersing said assembly in a fluidized dielectric at elevated temperature, filling the spacings between adjacent spaced boards with said fluidized dielectric, heating said solder bands to a molten state by said dielectric, wicking masses of said molten solder into clearances defined between said contacts and said plating lined holes receiving said contacts, substantially filling said clearances with molten solder by said wicking action, agglomerating additional masses of solder at each open end of said plating lined holes to form solder fillets encircling said contacts, removing said assembly from immersion in said dielectric, cooling said assembly to form rigid solder joints and to solidify masses of dielectric in the spacings between said adjacent boards to encapsulate said boards into a single multi-layer board and to provide a layer of dielectric insulation between adjacent boards, and applying a solvent to said assembly to remove undesired dielectric.

* * * * *